United States Patent
Murata et al.

(10) Patent No.: US 7,245,019 B2
(45) Date of Patent: Jul. 17, 2007

(54) SEMICONDUCTOR DEVICE WITH IMPROVED WIRING ARRANGEMENT UTILIZING A PROJECTING PORTION AND A METHOD OF MANUFACTURING THE SAME

(75) Inventors: Tomoo Murata, Fussa (JP); Shinobu Yabuki, Hamura (JP); Takeo Yamashita, Hamura (JP)

(73) Assignee: Hitachi, Ltd., Tokyo (JP)

( * ) Notice: Subject to any disclaimer, the term of this patent is extended or adjusted under 35 U.S.C. 154(b) by 191 days.

(21) Appl. No.: 10/647,373

(22) Filed: Aug. 26, 2003

(65) Prior Publication Data

US 2004/0056280 A1    Mar. 25, 2004

(30) Foreign Application Priority Data

Sep. 20, 2002   (JP)   ............................. 2002-274466

(51) Int. Cl.
    *H01L 23/52*   (2006.01)
(52) U.S. Cl. ................. 257/774; 257/734; 257/773; 257/E23.143; 438/584; 438/597; 438/618; 438/622
(58) Field of Classification Search ............... 257/773, 257/774, 775, 776, 734; 438/129, 250, 618, 438/666, 638, 286, 619, 668
    See application file for complete search history.

(56) References Cited

U.S. PATENT DOCUMENTS 5,014,104 A  *  5/1991  Ema

FOREIGN PATENT DOCUMENTS

| JP | 11-186433 | 7/1999 |
|----|-----------|--------|
| JP | 2001-44196 | 2/2001 |

* cited by examiner

*Primary Examiner*—Leonardo Andujar
*Assistant Examiner*—Kevin Quinto
(74) *Attorney, Agent, or Firm*—Antonelli, Terry, Stout & Kraus, LLP.

(57) ABSTRACT

In a method of manufacturing a semiconductor device having a first wiring extending in a first direction and a second wiring connected to the first wiring through a connection and extending in a second direction orthogonal to the first direction, the second wiring having a surplus portion projecting from the connection in a direction opposite to the second direction, the first and second wirings are arranged such that a center of the connection is offset in the second direction from a center of the first wiring, and a projecting portion of the first wiring is disposed under the connection.

37 Claims, 31 Drawing Sheets

FIG. 9

| CASE | RESERVOIR LENGTH (Lres) | CLOSEST TH ARRAY | RATE OF TH ARRAY (%) |
|---|---|---|---|
| 1 | $Lres \leq (P0-P1)/2$ | | 100% |
| 2 | $(P0-P1)/2 < Lres$ $Lres \leq (P0-P1)$ | | 75% |
| 3 | $(P0-P1) < Lres$ $Lres \leq (P0-P1) \times 2$ | | 66.7% |

SEMICONDUCTOR DEVICE WITH IMPROVED WIRING ARRANGEMENT UTILIZING A PROJECTING PORTION AND A METHOD OF MANUFACTURING THE SAME

BACKGROUND OF THE INVENTION

The present invention relates to a semiconductor device and a method of manufacturing the same. More particularly, the invention is concerned with a technique which is effective in the formation of a connection of wirings between different layers.

A semiconductor element and wiring, or wirings of different layers, are interconnected through a conductive film formed within a connecting hole. However, with microstructurization of semiconductor devices, studies are being made concerning a technique in which a portion, called a reservoir, is provided in an upper-layer wiring which overlies a connection. This technique is used for the following reason.

The reservoir represents a projecting portion (a surplus portion, a marginal portion) which is a part of the wiring and which projects from a wiring portion serving as a main current path. Although such a reservoir portion represents an unnecessary portion as a current path, it is formed for improvement of the electromigration (EM) resistance.

Electromigration is a phenomenon in which, when an electric current flows between upper- and lower-layer wirings through a connection, metal atoms which constitute the wirings and the connection migrate. As a result of this phenomenon, voids are formed within the wirings and the connection, causing a defective connection, such as breaking of the wire or a rise of the connection resistance.

However, if a reservoir is present, the reservoir serves as a metal atom supply source, whereby it is possible to decrease the rate of generation of voids and improve the electromigration resistance. Moreover, if a reservoir is present, it is possible to ensure a margin for pattern matching between wiring and a connection, whereby, even in the event of occurrence of mask displacement, it is possible to effect conduction between the wiring and the connection.

For example, Patent Literature 1 (Japanese Unexamined Patent Publication No. 2001-44196) discloses a technique in which a metallic reservoir 5a is provided above or below wiring to suppress the generation of voids caused by electromigration.

Further, Patent Literature 2 (Japanese Unexamined Patent Publication No. Hei 11(11999)-186433) describes the provision of a reservoir portion which improves the electromigration (EM) resistance.

SUMMARY OF THE INVENTION

The inventors of the present invention have been engaged in the research and development of semiconductor devices and have been studying the provision of a reservoir portion for improving the EM resistance.

Patterns of wirings of various layers and of connections located therebetween are arranged (layout) using automatic wiring tools [CAD (computer aided design) system], for example. At this time, optimization is effected so that the wiring and connection patterns are arranged in high density. However, in a layout which does not cause a wiring error in the absence of a reservoir, there occurs a wiring rule error (violation) in the presence of a reservoir, thus giving rise to the problem that the wiring efficiency (wiring mounting efficiency) is deteriorated, as will be described in detail later.

It is an object of the present invention to improve the wiring mounting efficiency and also improve the connection accuracy between wirings.

It is another object of the present invention to attain microstructurization or high density in a semiconductor device and also to attain high performance in the semiconductor device.

The above and other objects and novel features of the present invention will become apparent from the following description and the accompanying drawings.

Typical aspects of the invention disclosed herein will be outlined below.

(1) In a method of manufacturing a semiconductor device according to the present invention, steps are performed such that, (a) a first wiring extending in a first direction and (b) a second wiring connected to the first wiring through a connection and extending in a second direction orthogonal to the first direction, the second wiring having a surplus portion projecting from the connection in a direction opposite to the second direction, are disposed in such a manner that (c) a center of the connection is offset in the second direction from a center of the first wiring and that (d) a projecting portion of the first wiring is disposed under the connection.

(2) A semiconductor device according to the present invention comprises (a) a first wiring extending in a first direction and (b) a second wiring connected to the first wiring through a connection and extending in a second direction orthogonal to the first direction, the second wiring having a first surplus portion projecting in a direction opposite to the second direction, wherein (c) the connection is formed such that a center thereof is offset in the second direction from a center of the first wiring, and (d) a projecting portion of the first wiring is formed under the connection.

BRIEF DESCRIPTION OF THE DRAWINGS

FIG. 9 is a diagram showing a relation between reservoir length Lres and a percent layout of connections TH;

DETAILED DESCRIPTION OF THE PREFERRED EMBODIMENTS

Figure 1:
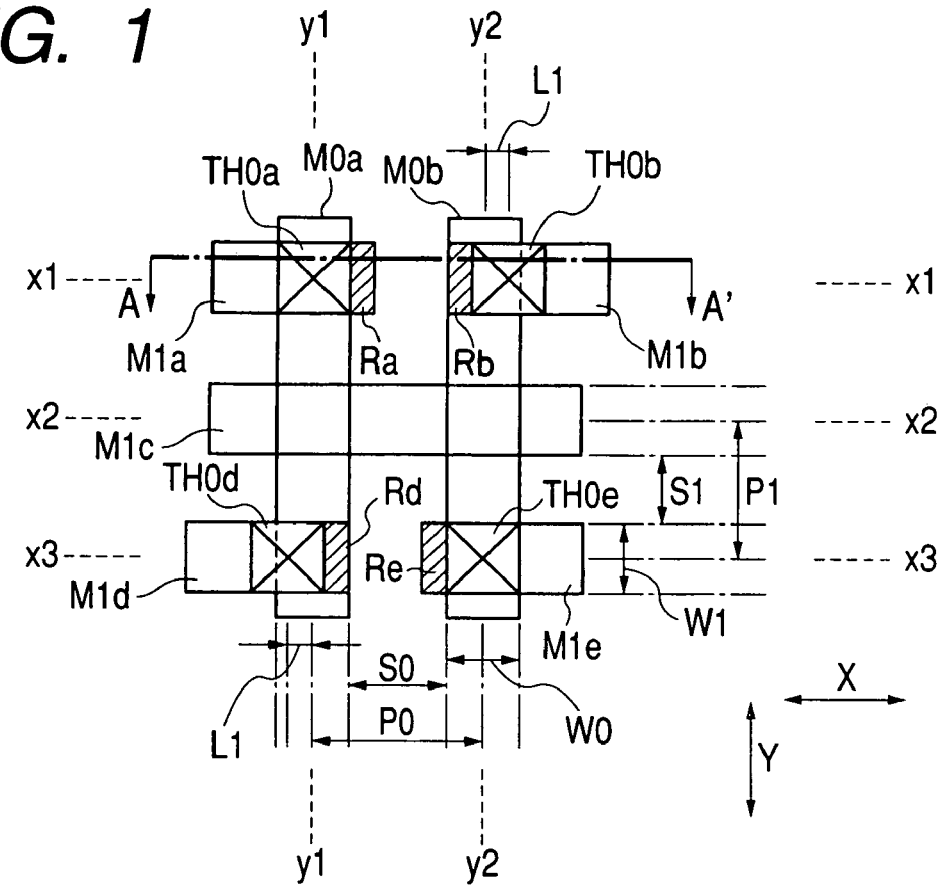
FIG. 1 is a plan view showing planar patterns of wirings (M0, M1) of various layers and those of connections formed between the wirings in a first embodiment of the present invention.

Embodiments of the present invention will be described in detail hereinunder with reference to the accompanying drawings. In all of the drawings, components having the same functions are identified by the same reference numerals, and repeated explanations thereof will be omitted.

First Embodiment

With reference to the drawings, a description will be given below of a method for disposing wirings, etc. in a semiconductor device of this first embodiment.

Figure 2:
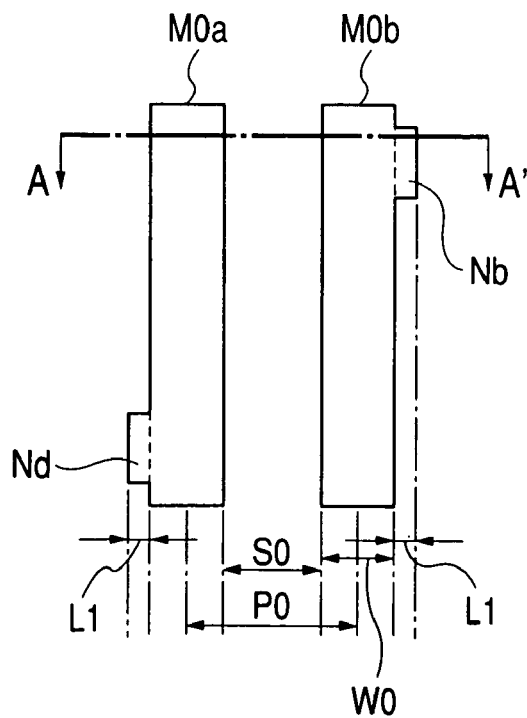
FIG. 2 is a detailed plan view which illustrates planar patterns of 0th layer wirings in the layout of FIG. 1.
Figure 3:
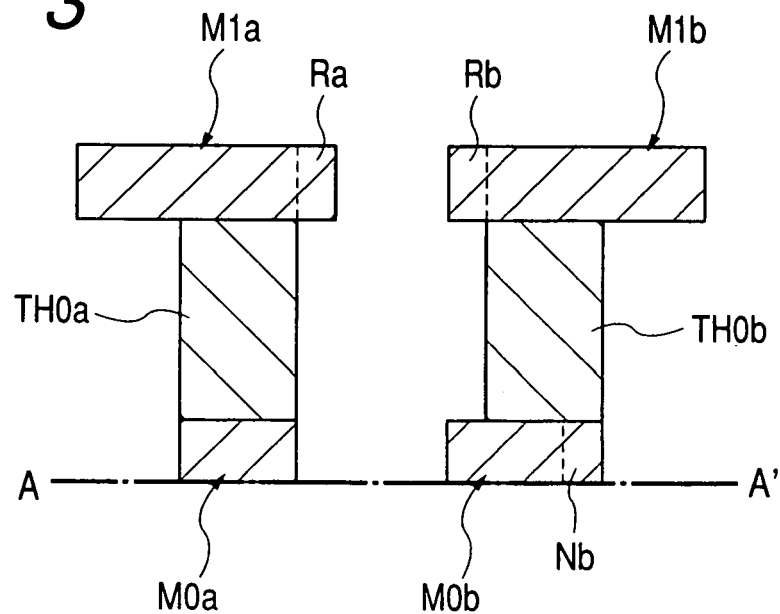
FIG. 3 is a sectional view of principal portions taken on line A–A' in FIG. 1.

FIG. 1 is a plan view showing planar patterns 0th layer wirings M0$a$, M0$b$, first layer wirings M1$a$~M1$e$, and connections TH0$a$, TH0$b$ between the 0th and the first layer wirings; FIG. 2 illustrates planar patterns of the 0th wirings M0$a$ and M0$b$ in the layout of FIG. 1; and FIG. 3 is a sectional view of principal portions taken on line A–A' in FIG. 1. An interlayer insulating film is present between wirings.

The following description is directed to the state of the wirings, etc. which are disposed in the semiconductor device of this embodiment.

0th layer wirings M0$a$ and M0$b$ are disposed along grids (layout lines, channels) y1 and y2 which extend in the Y direction. The grids consist of lines which are defined at equal intervals in the X or Y direction and which define a minimum wiring spacing between layers. The first layer wirings M1$a$ and M1$b$ are electrically connected to the 0th layer wirings M0$a$ and M0$b$ through connections TH0$a$ and TH0$b$. The first layer wirings M1$a$ and M1$b$ are disposed along a grid x1 which extends in the X direction.

More specifically, the first layer wiring M1$a$ extends leftwards (in the direction away from M0$b$) in the figure from above the connection TH0$a$, while the first layer wiring M1$b$ extends rightwards (in the direction away from M0$a$) in the figure from above the connection TH0$b$. The first layer wiring M1$a$ has a reservoir (a surplus portion or a marginal portion) Ra projecting rightwards in the figure from above the connection TH0$a$, while the first layer wiring M1$b$ has a reservoir Rb projecting leftwards in the figure from above the connection TH0$b$.

The distance P0 (diffusion pitch) is the distance between grids y1 and y2, i.e., the sum of a space S0 between 0th layer wirings and the width W0 of a 0th wiring. The distance P1 is the distance between grids x2 and x3 (x1 and x2), i.e., the sum of a space S1 between first layer wirings and the width W1 of a first layer wiring. The distances P0 and P1 are in a relation of P1<P0.

Figure 7:
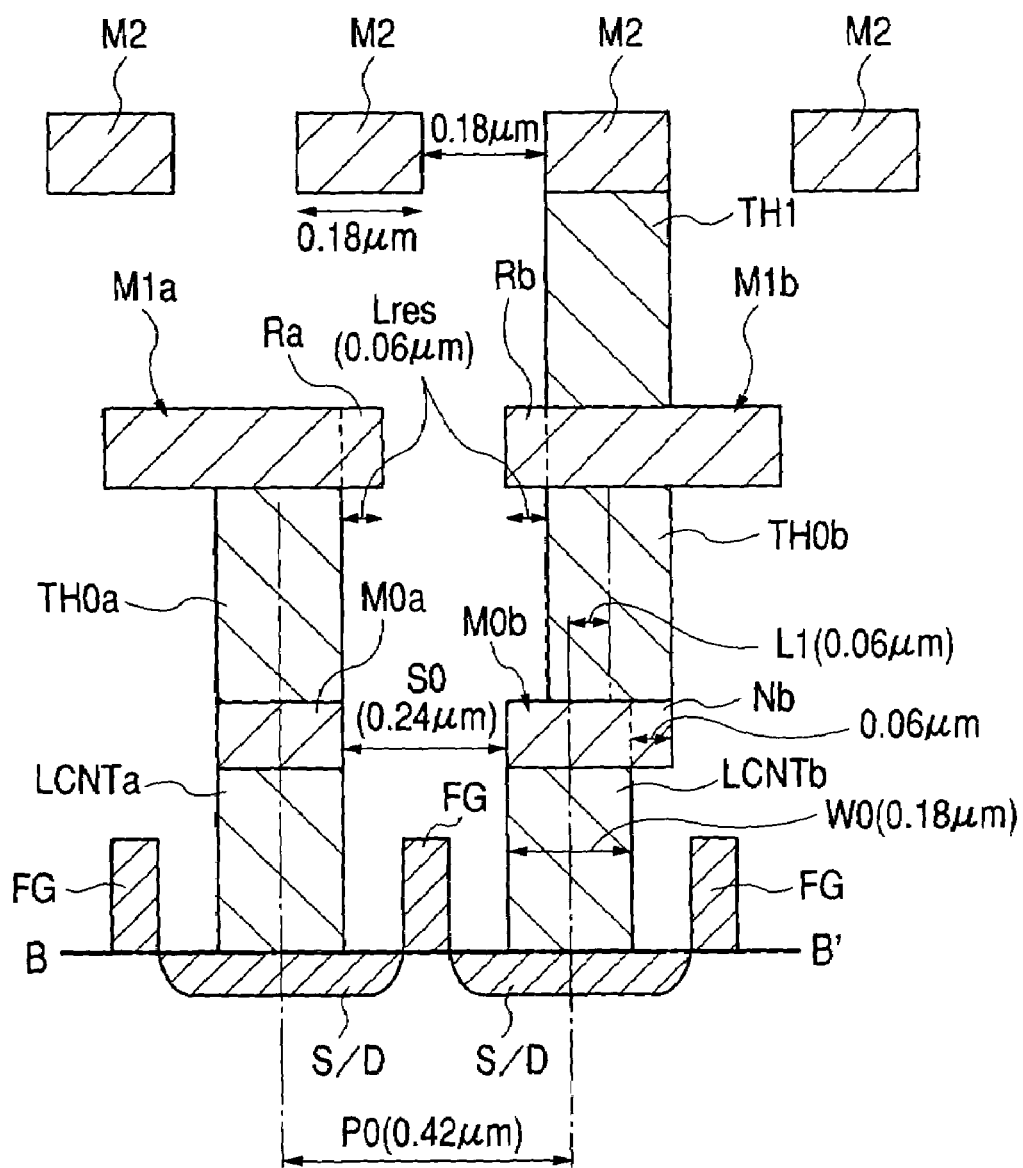
FIG. 7 is a sectional view taken along line B—B in FIG. 8, showing a relation among wirings (M0, M1) of various layers, connections formed therebetween, and gate electrodes, in the first embodiment.
Figure 8:
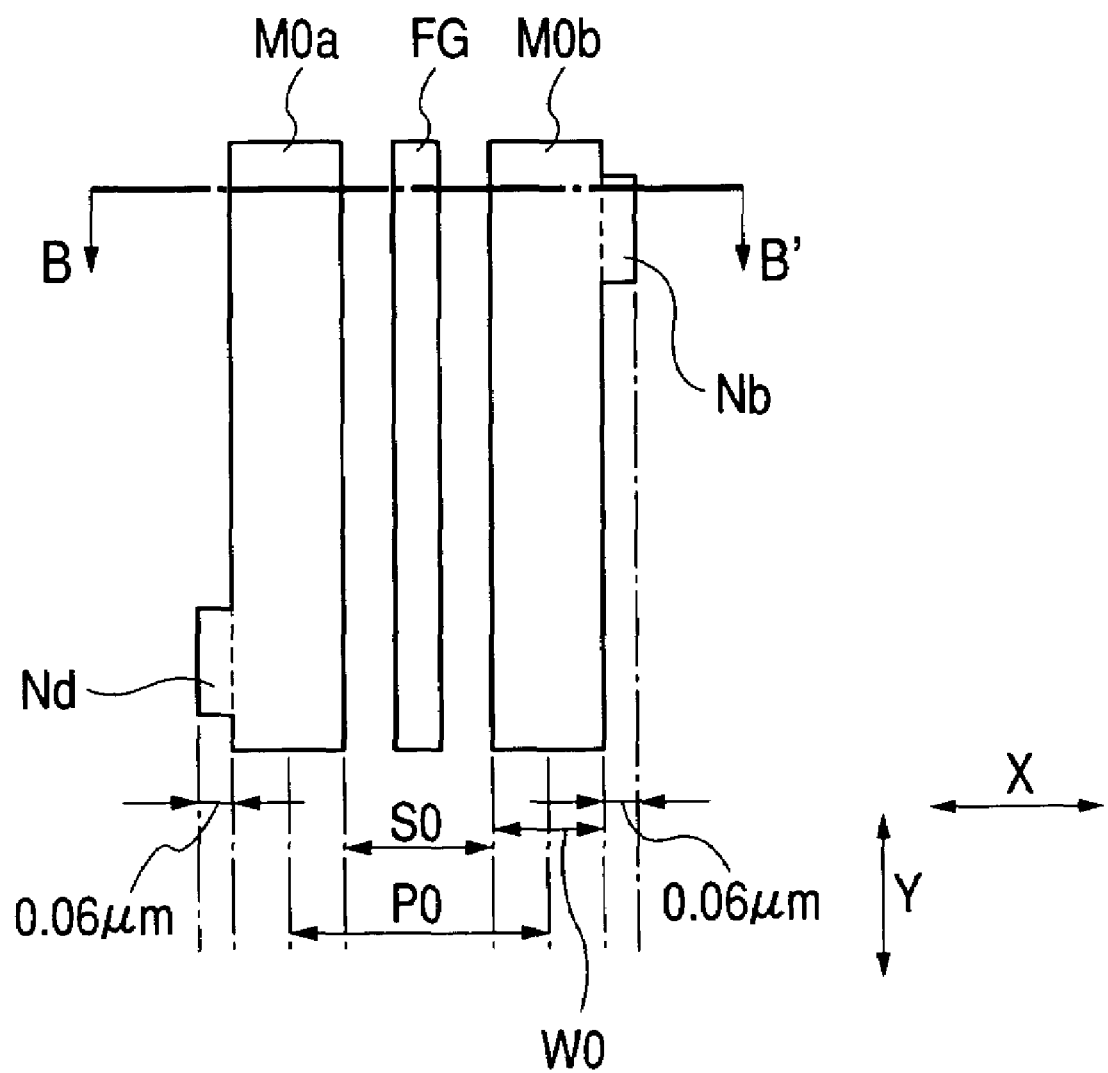
FIG. 8 is a plan view showing planar patterns of 0th wirings and a gate electrode in the first embodiment.

FIG. 7 is a sectional view of principal portions in which a MISFET (Metal Insulator Semiconductor Field Effect Transistor) is formed below each 0th layer wiring M0, and FIG. 8 is a plan view showing a relation of patterns of the 0th layer wirings M0 and a gate electrode FG of each MISFET. A section taken on line B–B' in FIG. 8 corresponds to FIG. 7.

For example, as shown in FIGS. 7 and 8, MISFETs are formed below the 0th layer wirings, a gate electrode FG is disposed in the Y direction between the 0th layer wirings M0, and a source-drain region S/D is connected to a 0th layer wiring M0 through a connection LCNT. In this case, it is necessary to provide a certain margin between the gate electrode FG and the connection LCNT in order to prevent shorting between the two. There is a growing tendency toward microstructurization of the MISFET, but in many cases the spacing between 0th layer wirings cannot be made to conform to a minimum machining size (wiring width=wiring spacing=F). On the other hand, the first layer wirings M1 can be disposed at a minimum machining size because they are not influenced by the layout of underlying elements, etc. Thus, in many cases, the spacing between 0th layer wirings (between grids y) is larger than that between first layer wirings (between grids x), (P1<P0).

FIG. 7 shows an example of the sizes of the various portions. As shown in the figure, P0 is 0.42 μm, S0 is 0.24 μm, W0 is 0.18 μm, and the reservoir length Lres is 0.06 μm. The reservoir length indicates the distance from a reservoir-side end portion of a connection TH0 to an end portion of the reservoir. S1 and W1 are each, for example, 0.18 μm, and P1 is 0.36 μm. As shown in FIG. 7, the second layer wirings M2 which extend in the same direction (Y direction) as the 0th layer wirings M0 may be disposed above the first layer wirings M1 through an interlayer insulating film. For example, the width of each second layer wiring M2 and the spacing between adjacent second layer wirings M2 are each 0.18 μm, which value corresponds to a minimum size allowable between wirings. A first layer wiring M1 and a second layer wiring M2 are connected with each other through a connection TH1, for example.

Figure 38:
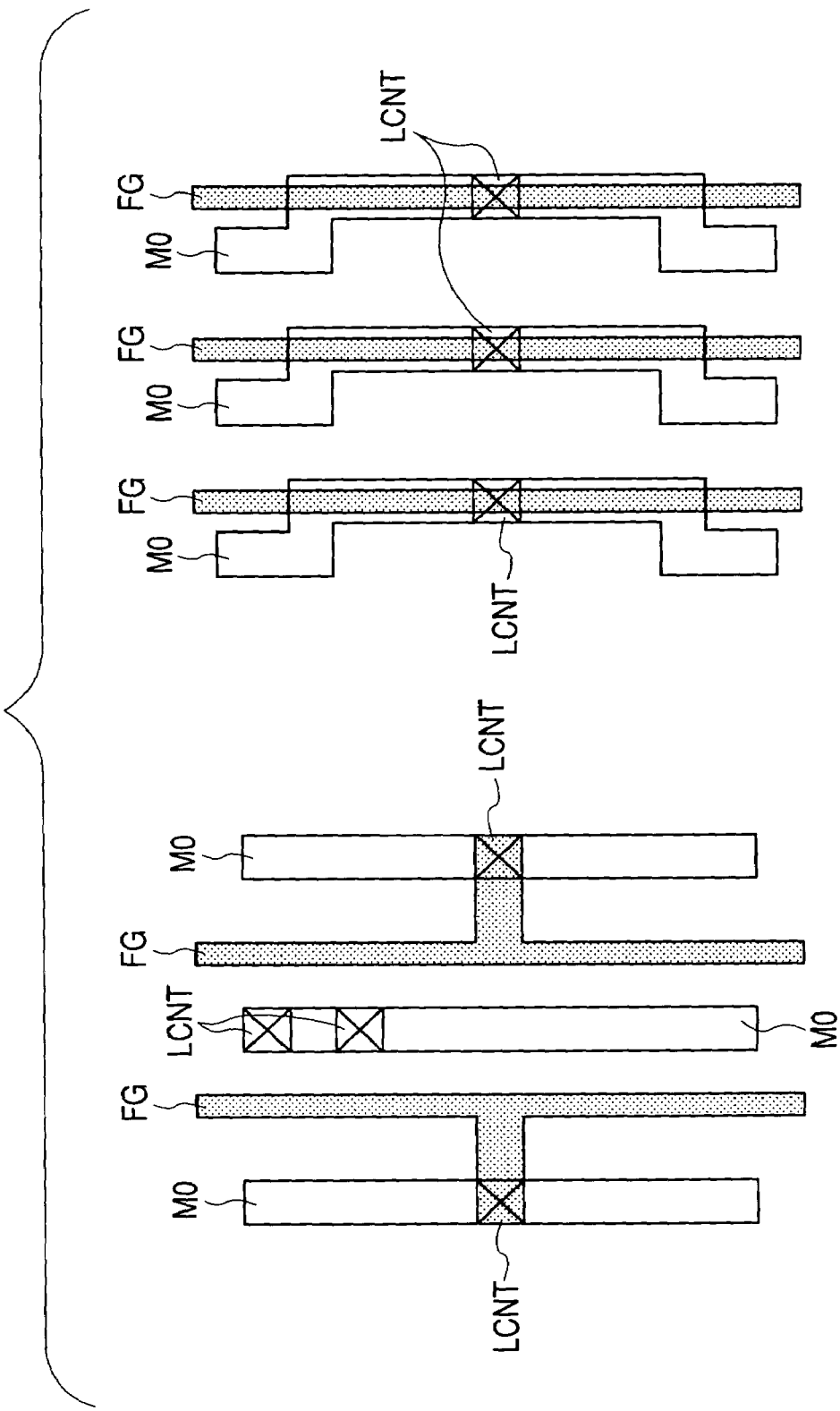
FIG. 38 is a plan view showing planar patterns of 0th layer wirings and gate electrodes according to a modification of the first embodiment.

In FIG. 7, the source-drain region D/S of each MISFET and a 0th layer wiring M0 are connected with each other through a connection LCNT, but, as shown in FIG. 38, a gate electrode FG may be connected to a 0th layer wiring M0 through a connection LCNT. In some case, the connection above the gate electrode is designated FCNT, but for convenience' sake it is here designated LCNT.

On the left-hand side of FIG. 38 there is illustrated a case where gate electrodes FG are each provided with a projecting portion (wiring portion), and the projecting portion is connected to a 0th layer wiring M0 through a connection LCNT. On the right-had side of FIG. 38 there is illustrated a case where a connection is provided on each gate electrode FG, and further a 0th layer wiring M0 is disposed thereon.

Thus, as the case may be, the 0th layer wirings M0 are disposed not only on the source-drain regions S/D of MISFETs, but also on gate electrodes FG, whereby it is possible to shorten the path for the supply of electric current to each of the gate electrodes FG.

As shown in FIG. 1, etc., the center of the connection TH0b on the 0th layer wiring M0b is offset by a distance L1 (0.06 μm in FIG. 7) rightwards from an intersecting point of grids y2 and x1. On the other hand, the center of the connection TH0a on the 0th layer wiring M0a lies on an intersecting point of grids x1 and y1 (FIG. 1).

Further, a notch (a projecting portion or a wide portion) of the 0th layer wiring M0b is formed below the connection TH0b on the 0th layer wiring M0b(see FIG. 2). That is, the connection TH0b is formed so as to be positioned on both 0th layer wiring M0b and notch Nb and connected to the first layer wiring M1b. It is preferable that the length of the notch Nb in the X direction be set equal to the distance L1, which is, for example, 0.06 μm in FIG. 7. Since the 0th layer wirings M0 are spaced by a distance of not less than a minimum size which is allowed between wirings, a required wiring spacing can be ensured even if the notch is provided.

Thus, in this first embodiment, when first layer wirings extending in mutually opposite directions on the same line are disposed on the 0th layer wirings disposed on adjacent grids, the connections on the 0th layer wirings are offset in the extending direction of the overlying first layer wirings, and the 0th layer wirings which underlie the thus-offset connections are each formed with a notch.

As a result, even in the case where the first layer wirings are provided with reservoirs, it is possible to ensure a required spacing between adjacent reservoirs, such as between reservoirs Ra and Rb or between reservoirs Rd and Re. That is, since it is possible to ensure a required spacing in the X direction between the first layer wirings disposed on the same grid, it becomes possible to increase the wiring density, and, hence, it is possible to improve the wiring mounting efficiency.

Figure 4:
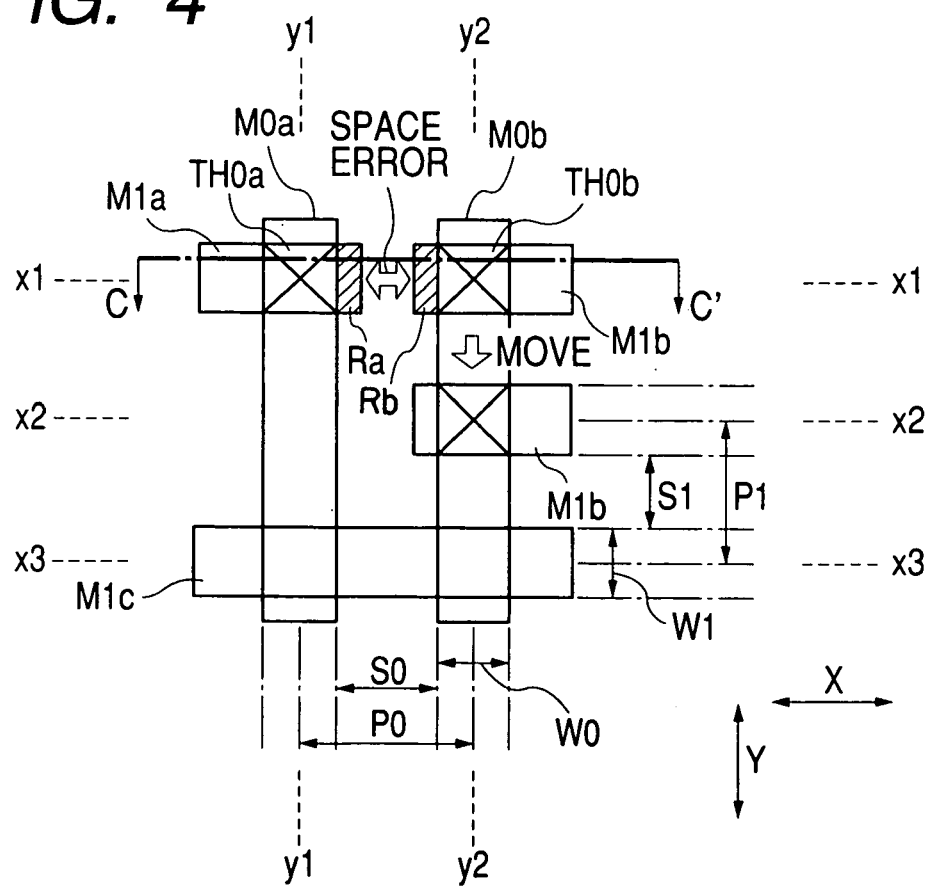
FIG. 4 is a plan view showing planar patterns of wirings (M0, M1) of various layers and those of connections formed between the wirings, which plan view illustrates the effect of the first embodiment.
Figure 5:
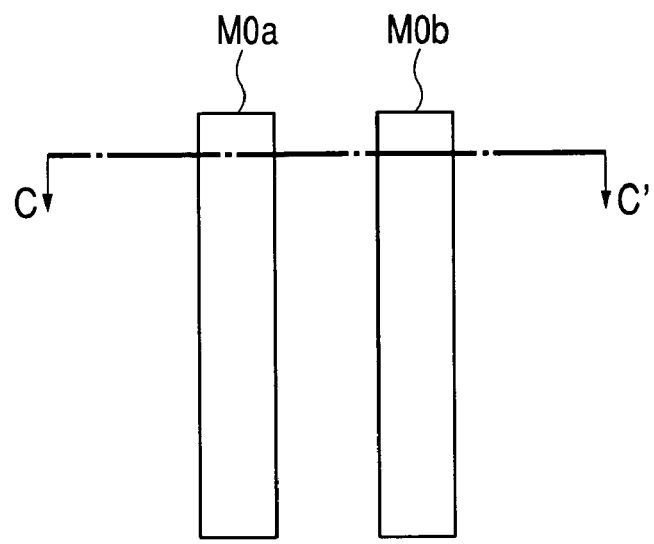
FIG. 5 is a detailed plan view which illustrates planar patterns of 0th layer wirings in the layout of FIG. 4.
Figure 6:
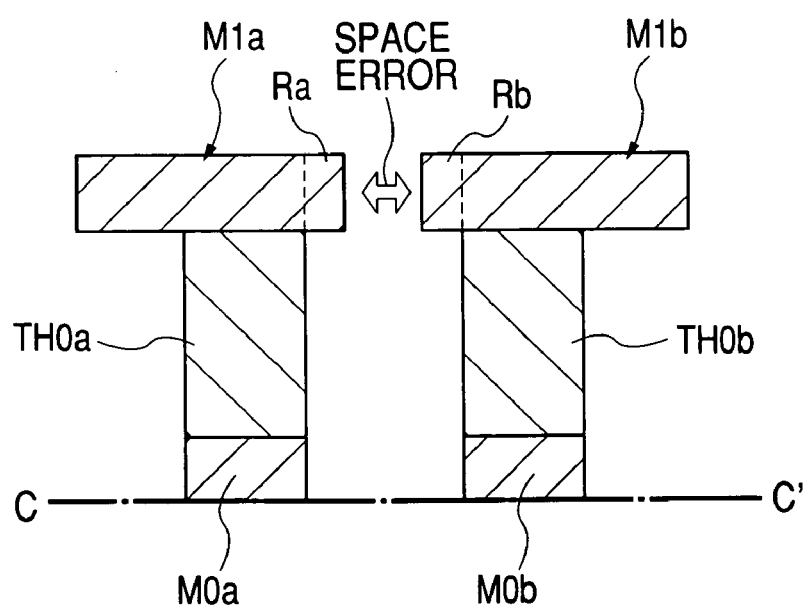
FIG. 6 is a sectional view of principal portions taken on line C–C' in FIG. 4.

For example, when the center of the connection TH0b on the 0th layer wiring is disposed at an intersecting point between grids y2 and x1, as shown in FIG. 4, the spacing between first layer wirings in the X direction becomes smaller than in FIG. 1; and, if it becomes smaller than a predetermined distance, this state is regarded as a wiring rule error (space error). FIG. 5 illustrates planar patterns of the 0th layer wirings M0a and M0b in the layout of FIG. 4, and FIG. 6 is a sectional view of principal portions taken on line C–C' in FIG. 4.

In the event of occurrence of a space error, the first layer wiring M1b is compelled to move onto another grid, e.g., grid x2 (FIG. 4). This results in a situation in which the first layer wiring M1c is compelled to be disposed so as to keep off from the grid x2 and, therefore, the wiring freedom is greatly impaired. For example, in case it is necessary to adopt such means as moving onto another grid (e.g. grid x3), with the result that the number of grids necessary for laying out the wirings in question (M1a~M1c) increases and the effective area becomes larger, the wiring mounting efficiency is deteriorated.

On the other hand, according to the wiring method of this embodiment, as noted earlier, the region of the first layer wiring M1c can be ensured on the grid x2 even in the case where a reservoir is provided. That is, since it is possible to ensure a required spacing in the X direction between adjacent first layer wirings disposed on the same grid, it becomes possible to dispose another net like the first layer wiring M1c on grids which are adjacent to each other in the Y direction, whereby it is possible to improve the wiring freedom and also improve the wiring density and mounting efficiency. As a result, it is possible to effect microstructurization (reduction of chip size) and high integration of the semiconductor device. The first layer wiring M1c (another net) is not connected to the 0th layer wirings M0a and M0b, but is electrically connected, for example, to another 0th layer wiring M0 which is isolated in the X direction or to a second layer wiring M2 which overlies the first layer wirings M1 at a position isolated in the X direction.

In a semiconductor device, although the details will be described later, plural elements are connected together through multiple layers of wirings. For example, even with a one-grid reduction of cell area per unit cell, it is possible to obtain a great effect as a whole in the semiconductor device.

Besides, it is possible to shorten the length of each wiring for connection between elements, and, hence, it is possible to realize a high-speed drive of the semiconductor device. Moreover, by shortening the wiring length, it is possible to diminish the wiring resistance and reduce the power consumption of the semiconductor device. Thus, it is possible to improve the reliability of the semiconductor device.

Further, as shown in FIG. 1, etc., since the reservoirs Ra and Rb are provided in the first layer wirings M1a and M1b on the connections TH0*a* and TH0*b*, even upon migration of metal atoms which constitute the wirings and the connections, the reservoirs serve as a metal atom supply source to diminish the generation rate of voids and improve the electromigration (EM) resistance. Moreover, it is possible to ensure a margin for pattern matching of the wirings and the connections; and, even in the event of occurrence of mask displacement, it is possible to ensure conduction between the wirings and the connections. Thus, it is possible to improve the connection accuracy between wirings, and, hence, it is possible to improve the reliability of the semiconductor device.

Reference will now be made to the reservoir length Lres. For improvement of the EM resistance, the larger the reservoir length, the better. However, a too large length thereof will result in a lowering of the wiring mounting efficiency. FIG. 9 is a diagram showing a relation between the reservoir length Lres and a percent layout of the connections TH.

For example, as shown in FIG. 9, consideration is here given to a case where the first layer wirings M1 are disposed through connections TH onto six 0th layer wirings M0, which extend side by side in the Y direction.

As shown in a Case 1, in the case where the reservoir length Lres is set at one half or less of the difference between the distances P0 and P1, [Lres☐(P0−P1)/2], it is possible to dispose connections TH side by side on the same grid x. That is, the percent layout of connections (percent TH layout) becomes 100%. The 0th layer wirings M0, the first layer wirings M1, and the connections TH are equal in width, and this width and the spacing between adjacent first layer wirings M1 are each assumed to be a minimum machining size.

As shown in a Case 2, if the reservoir length Lres is set to be larger than one half of the difference between the distances P0 and P1 and not larger than the difference, [(P0−P1)/2≦Lres☐(P0−P1)], only three connections TH can be disposed continuously at intersecting points of one grid x with grids y thereon, with no TH capable of being disposed on the next grid y. The percent layout of connections (percent TH layout) in Case 2 is 75% of that in Case 1. In this case, it is necessary that the 0th layer wirings M0 and the connections TH be offset from each other with respect to the centers thereof. However, since the reservoir length can be made larger than in Case 1, it is possible to improve the EM resistance and, hence, improve the wiring reliability.

As shown in a Case 3, if the reservoir length Lres is set to be larger than the difference between the distances P0 and P1 and not larger than twice the difference, [(P0−P1)<Lres≦2(P0−P1)], it is possible to improve the Em resistance of the wirings, but only two connections TH can be disposed continuously at intersecting points of one grid x with grids y thereon, with no grid capable of being disposed on the next grid y. As a result, the percent layout of connections becomes 66.7% as compared with that in Case 1. Also, in this case, it is necessary that the 0th layer wirings M0 and the connections TH be offset from each other with respect to the centers thereof.

If the reservoir length Lres is set to be larger than one half of the difference between the distances P0 and P1, [(P0−P1)/2<Lres], and if the 0th layer wirings M0 and the connections TH are not centrally offset from each other, the percent layout of connections becomes 50%.

Thus, in all of the Cases 1 to 3, the percent layout of connections is improved, but in Case 1 the EM resistance is deteriorated due to a relatively short reservoir length. In Case 3, the offset between the wiring center and each connection becomes larger, so that the notch becomes larger and the freedom of wiring layout is greatly impaired. As a result, it becomes necessary to dispose the first layer wirings M1 so as to keep off from the same grid x, and thus there is a fear that the effective area of wiring may be deteriorated. Further, the wiring route becomes complicated, with a consequent likelihood of delay in the transfer of a signal.

Accordingly, it is considered preferable to set the reservoir length Lres as in Case 2, i.e., larger than one half of the difference between the distances P0 and P1 and not larger than the difference, [(P0−P1)/2<Lres≦(P0−P1)].

Also when the reservoir length Lres is defined as in Case 1, a notch N may be formed in each 0th layer wiring M0, and each connection TH may be offset from the center of the 0th layer wiring M0. That is, it is possible to form a notch N as in Case 2 and Case 3 and form a connection TH on the notch N. Likewise, even when the reservoir length Lres is defined as in Case 2, a connection TH can be formed on such a long notch N as in Case 3.

The Cases 1 to 3 may be combined according to the degree of wiring density of each wiring layer. More particularly, when it is not necessary to dispose the wiring closely, or when it is desired to ensure the reliability of the wiring, there may be a wiring area where the wiring is disposed in accordance with the method of Case 3. Conversely, when the wiring must be made at a high wiring density, the method of Case 1 (definition of reservoir length and wiring method) may be adopted.

In the foregoing example, of the connections TH0*a* and TH0*b* on the grid x1, the connection TH0*b* is offset with its center to the right side, the center of TH0*a* may be displaced to the left side.

A description will be given below of a case where a connection which underlies any of the first layer wirings disposed on one and same grid y has its center offset to the left side. Reference will be made to a first layer wiring M1*d* as an example (see FIG. 1).

First layer wirings M1*d* and M1*e* are disposed along the grid x3 and are electrically connected to the 0th layer wirings M0*a* and M0*b* respectively through connections TH0*d* and TH0*e*. The first layer wiring M1*d* extends leftwards in the figure from above the connection TH0*d*, while the first layer wiring M1*e* extends rightwards in the figure from above the connection TH0*e*.

The first layer wiring M1*d* has a reservoir Rd projecting rightwards in the figure from above the connection TH0*d*, while the first layer wiring M1*e* has a reservoir Re projecting leftwards in the figure from above the connection TH0*e*. The distances P0 and P1 are in a relation of P1<P0.

The center of the connection TH0*d* on the 0th layer wiring M0*a* is offset by a distance L1 leftwards from an intersecting point of grids y1 and x3. On the other hand, the center of the connection TH0*e* on the 0th layer wiring M0*b* lies on an intersecting point of grids y2 and x3.

A notch Nd of the 0th layer wiring M0*a* is formed below the connection TH0*d* on the 0th layer wiring M0*a* (see FIG. 2). The 0th layer wiring M0 is not disposed at a minimum machining size, so even if the notch is provided, it is possible to ensure the required wiring spacing.

Thus, the center of the connection TH0*d* is offset leftwards and the notch Nd is formed in the 0th layer wiring M0*a*, so that even, in the case where reservoirs Rd and Re are provided in the first layer wirings (M1*d*, M1*e*), it is possible to ensure their spacing in the X direction, and, hence, it is possible to improve the wiring mounting efficiency.

Second Embodiment

A semiconductor device is designed by utilizing a computer (CAD). CAD is essential for a short-period development of LSI (Large Scale Integrated Circuit). A computer system (CAD system) used for CAP is constituted by a group of CAD tools, which are used according to various design steps. In other words, the CAD tools are software programs developed for a specific purpose. Thus, the wirings described in the first embodiment can also be laid out automatically using a CAD tool.

The following description is directed to a CAD tool (automatic wiring tool) for realizing the wiring layout described in the first embodiment. The shape, etc. of wirings laid out using CAD tools in this second embodiment are the same as in the layout which has been described above with reference to FIG. 1, etc. in connection with the first embodiment, so that the details thereof will be omitted.

As described in the first embodiment, there are various conditions for the layout of wiring. a) The 0th layer wirings M0 are disposed on grid y. b) The first layer wirings M1 are disposed on grid x. c) The connections TH0 between the 0th and the first layer wirings are disposed at intersecting points of grids x and y. d) Reservoirs are provided on the first layer wirings M1.

Figure 10:
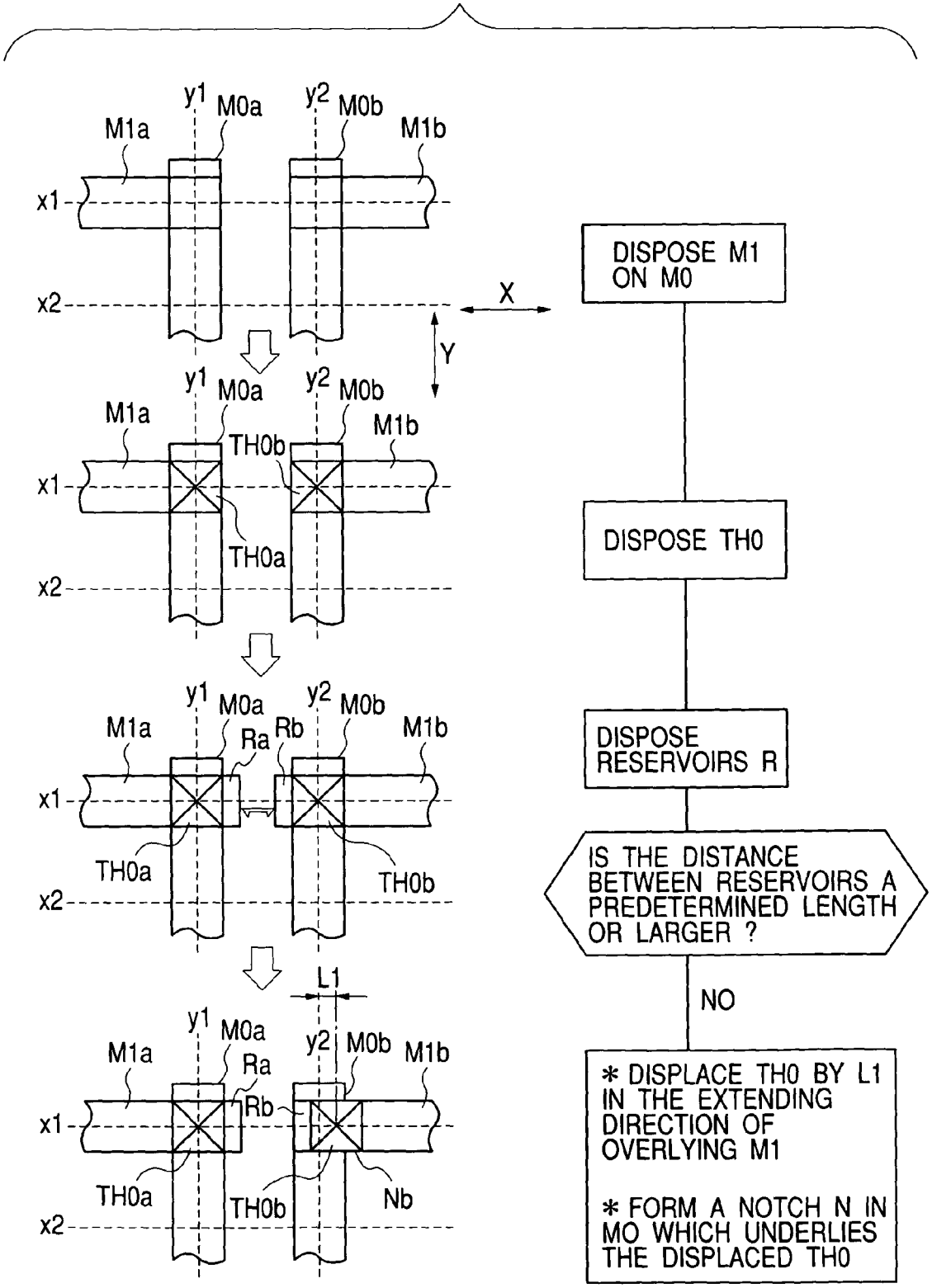
FIG. 10 is a flow chart showing a method for disposing wirings, etc. in a second embodiment of the present invention.

(1) First, with reference to FIG. 10, a description will be given of a model (M0 model) in which connections TH0 and first layer wirings M1 are disposed on 0th layer wirings M0.

It is assumed that 0th layer wirings M0$a$ and M0$b$ have been disposed optimally in a step which precedes the step using the CAD tool.

First layer wirings M1$a$ and M1$b$ are disposed optimally on the 0th layer wirings M0$a$ and M0$b$. Here the reservoir length is not taken into account.

Next, connections TH0$a$ and TH0$b$ are disposed at intersecting points of the 0th layer wirings M0 and the first layer wirings M1.

Then, reservoirs Ra and Rb are added to the first layer wirings M1 and a check is made to see if the spacing between the two in the X direction is a predetermined length or more. The predetermined length indicates, for example, a minimum size which is allowed between wirings.

If the spacing is below the predetermined length, one of the connections TH0 underlying the first layer wirings M1 is displaced in the extending direction of the first layer wirings. In FIG. 10, the connection TH0$b$ is displaced a distance L1 rightwards.

Further, a notch N of a first layer wiring M0 is added to the space below the thus-displaced connection. In FIG. 10, a notch Nb is added to the 0th layer wiring M0$b$.

Without going through these steps, the first layer wirings M1 and the connections TH0 may be disposed using a program which permits the connections TH0 underlying the first layer wirings M1, including the reservoirs, to be offset in the extending directions of the fist layer wirings M1 from intersecting points of the grids.

Figure 11:
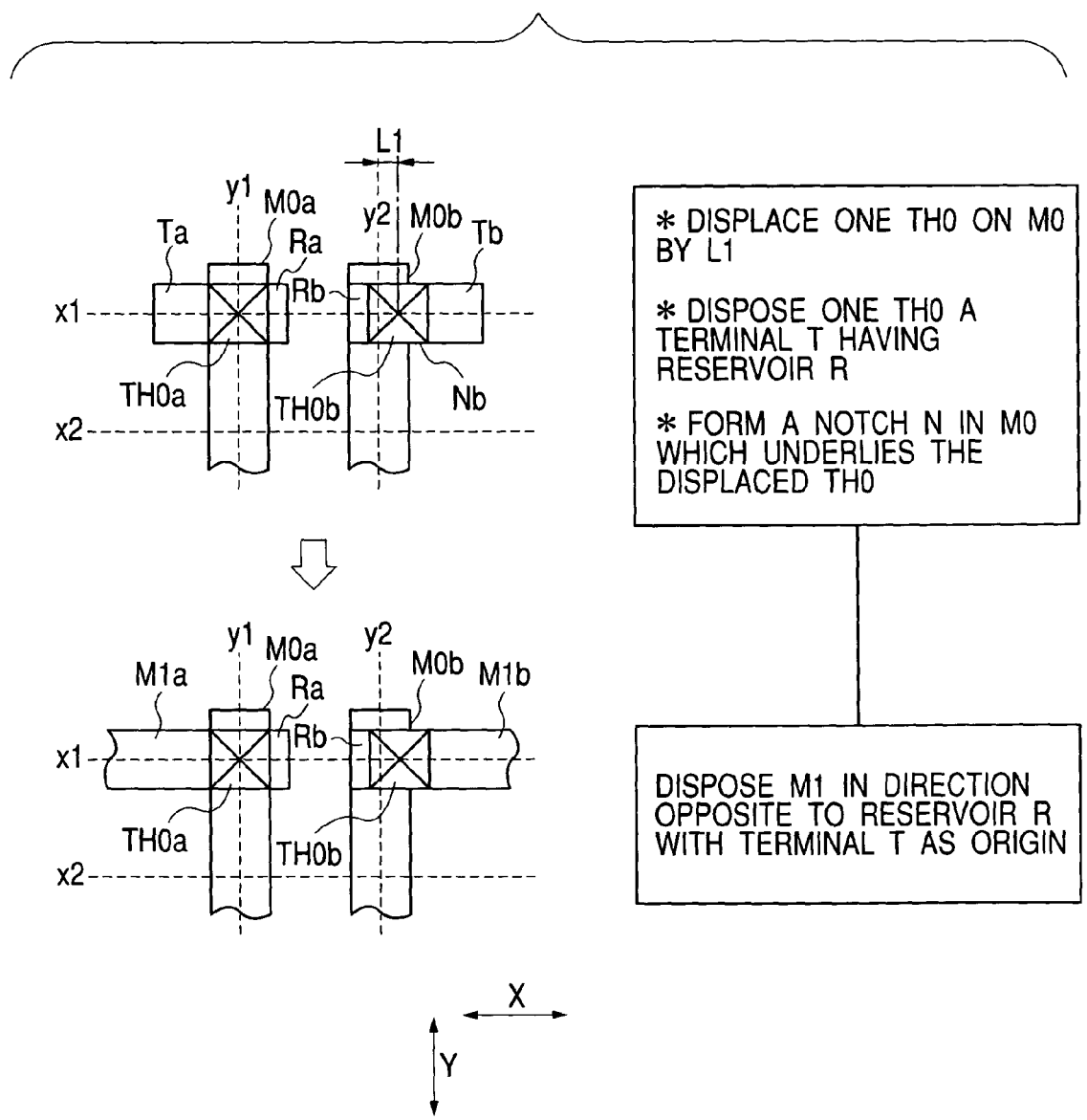
FIG. 11 is a flow chart showing another method for disposing wirings, etc. in the second embodiment.

(2) Next, with reference to FIG. 11, the following description is directed to a model (M1 model) in which connections TH0 disposed offsetwise on the 0th layer wirings M0 and terminals T (part of the first layer wirings M1) formed thereon are defined and the first layer wirings are disposed with the terminals T as origins.

That is, one of the connections TH0 at points of intersection with grid x1 on the 0th layer wirings M0$a$ and M0$b$ which are disposed optimally on grids y1 and y2 is disposed in such a manner that the center thereof is offset in the X direction from the intersecting point. In FIG. 11, the connection TH0$b$ is displaced a distance L1 rightwards. A terminal Tb having a reservoir Rb is disposed on the connection TH0$b$ in a direction opposite to the offset direction of the connection TH0$b$. Further, a notch Nb is formed in the 0th layer wiring M0$b$ which underlies the displaced terminal Tb.

The other connection TH0$a$ is disposed on a point of intersection with grid x1, and a terminal Ta having a reservoir Ra is disposed on the connection TH0$a$ on the right-hand side of the connection TH0$a$.

On the basis of position information of the terminals Ta and Tb the first layer wirings M1 are disposed automatically so as to extend from the terminals T in directions opposite to the reservoirs R. In other words, the first layer wirings M1 are disposed optimally with the terminals T as origins.

In this M1 model, the positions of the connections TH0 (terminals T) are limited in advance, so there is a fear that the wiring mounting efficiency may become lower than in the foregoing M0 model.

In this M1 model, however, there are less conditions for disposing the first layer wirings M1, and, therefore, it is possible to shorten the TAT (turn around time) of wiring design. That is, in the M0 model, it is necessary to perform the wiring design (mounting) while making comprehensively a layout combination of the connections TH0 and overlying the first layer wirings M1 with the 0th layer wirings M0.

For example, also in the example shown in FIG. 1, it is possible to dispose connections TH0 at three intersecting points on the 0th layer wirings M0, and, in proportion to the large design freedom, it takes a longer time for establishing an optimal layout. Particularly, in the M0 model, if the condition that the connections TH0 should be disposed at intersecting points of grids is removed, and if it is possible to dispose them at positions that are deviated from such intersecting points, it takes still more time for establishing an optimal layout.

FIG. 1 merely illustrates an area of 2×3 grids, but actually plural elements (cells) are interconnected by multi-layer wirings, etc., and for the design of wiring under a comprehensive combination of such interconnections, it is necessary to improve the computer' calculation capacity and the time required for calculation becomes longer.

On the other hand, in the M1 model, it is possible to shorten the TAT of wiring design, and a conventional CAD system is employable.

Third Embodiment

Although in the first embodiment only the connection TH0$b$, of the connections TH0$a$ and TH0$b$ that are disposed adjacent to each other, is disposed offsetwise (see FIG. 1), the adjacent connections TH0$a$ and TH0$b$ may be displaced in directions opposite to each other (away from each other).

With reference to the drawings, a description will be given below of a method for disposing wirings, etc. in the semiconductor device of this embodiment. This third embodiment is the same as the first embodiment, except for the layout positions of connections and first layer wirings, so that corresponding portions are identified by the same reference numerals, and only different portions will be described in detail below.

Figure 12:
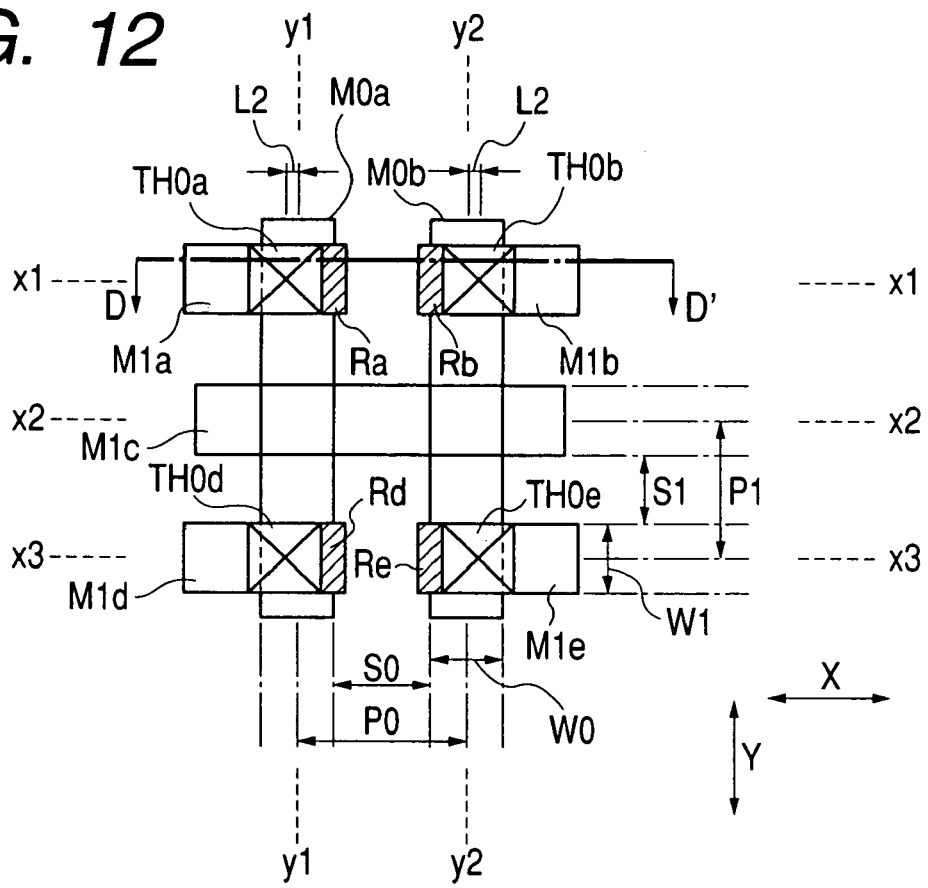
FIG. 12 is a plan view showing planar patterns of wirings (M0, M1) of various layers and those of connections formed between the wirings in a third embodiment of the present invention.
Figure 13:
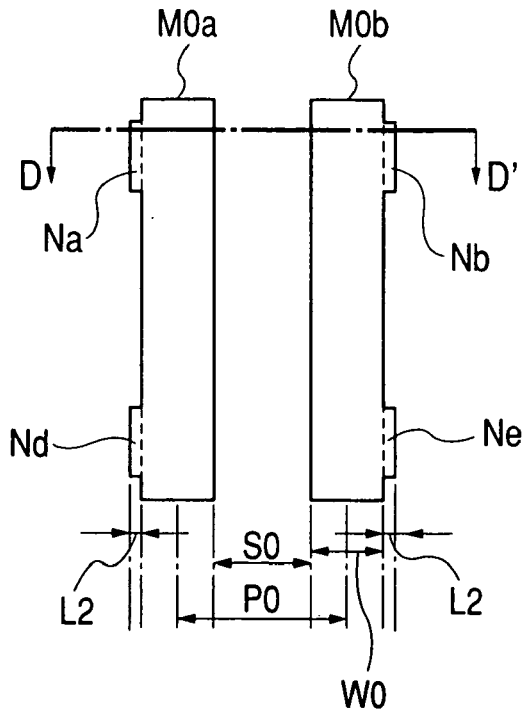
FIG. 13 is a detailed plan view which illustrates planar patterns of 0th layer wirings in the layout of FIG. 12.
Figure 14:
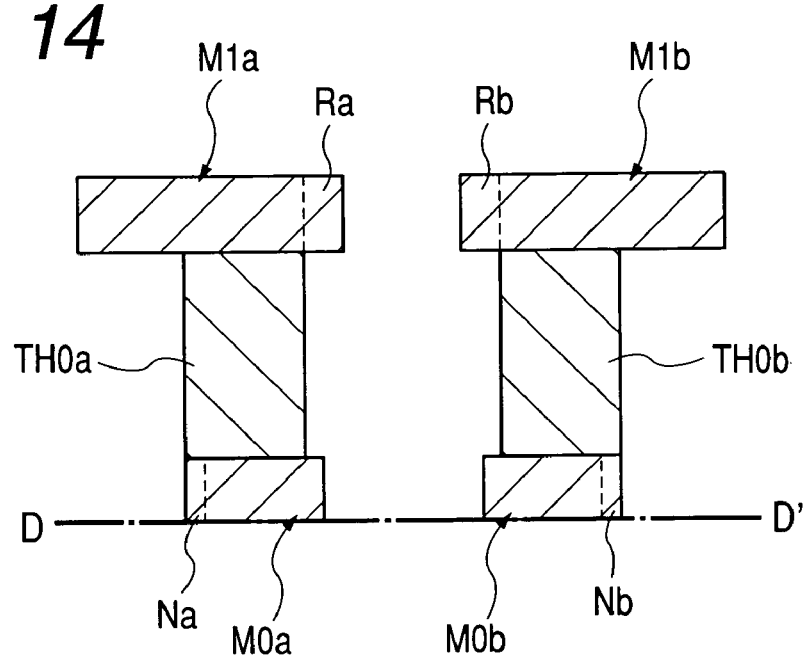
FIG. 14 is a sectional view of principal portions taken on line D–D' in FIG. 12.

FIG. 12 is a plan view showing planar patterns of 0th layer wirings M0$a$, M0$b$, first layer wirings M1$a$ to M1$e$, and connections TH0$a$ and TH0$b$ between the 0th and the first layer wirings. FIG. 13 illustrates planar patterns of the 0th layer wirings M0a and M0b in the layout of FIG. 12, and FIG. 14 is a sectional view of principal portions taken on line D–D' in FIG. 12. The state of the layout of wirings, etc. in the semiconductor device of this embodiment will be described below with reference to FIGS. 12 to 14.

The 0th layer wirings M0a and M0b are disposed along grids y1 and y2, respectively, and they are electrically connected through connections TH0a and TH0b to the first layer wirings M1a and M1b, respectively, which are disposed along grid x1.

More specifically, the first layer wiring M1a extends leftwards in the figures from above the connection TH0a, while the first layer wiring M1b extends rightwards in the figures from above the connection TH0b. The first layer wiring M1a has a reservoir Ra projecting rightwards in the figures from above the connection TH0a, while the first layer wiring M1b has a reservoir Rb projecting leftwards in the figures from above the connection TH0b.

Distance P0 is the distance between grids y1 and y2, corresponding to the sum of a space S0 between the 0th layer wirings and the width W0 of a 0th layer wiring. Distance P1 is the distance between grids x1 and x2, corresponding to the sum of a space S1 between the first layer wirings and the width W1 of a first layer wiring. P1 and P0 are in a relation of P1<P0.

If gate electrodes FG underlie the 0th layer wirings in the Y direction, as described in the first embodiment, the relation of P1<P0 is satisfied in many cases.

Figure 15:
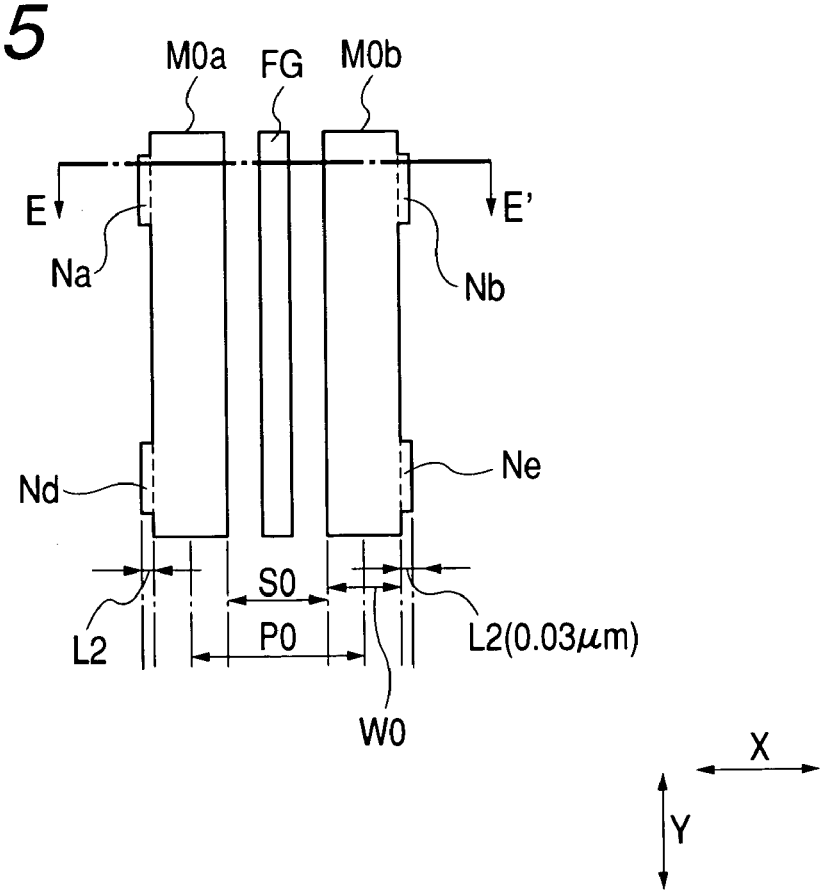
FIG. 15 is a plan view showing planar patterns of 0th layer wirings and a gate electrode in the third embodiment.
Figure 16:
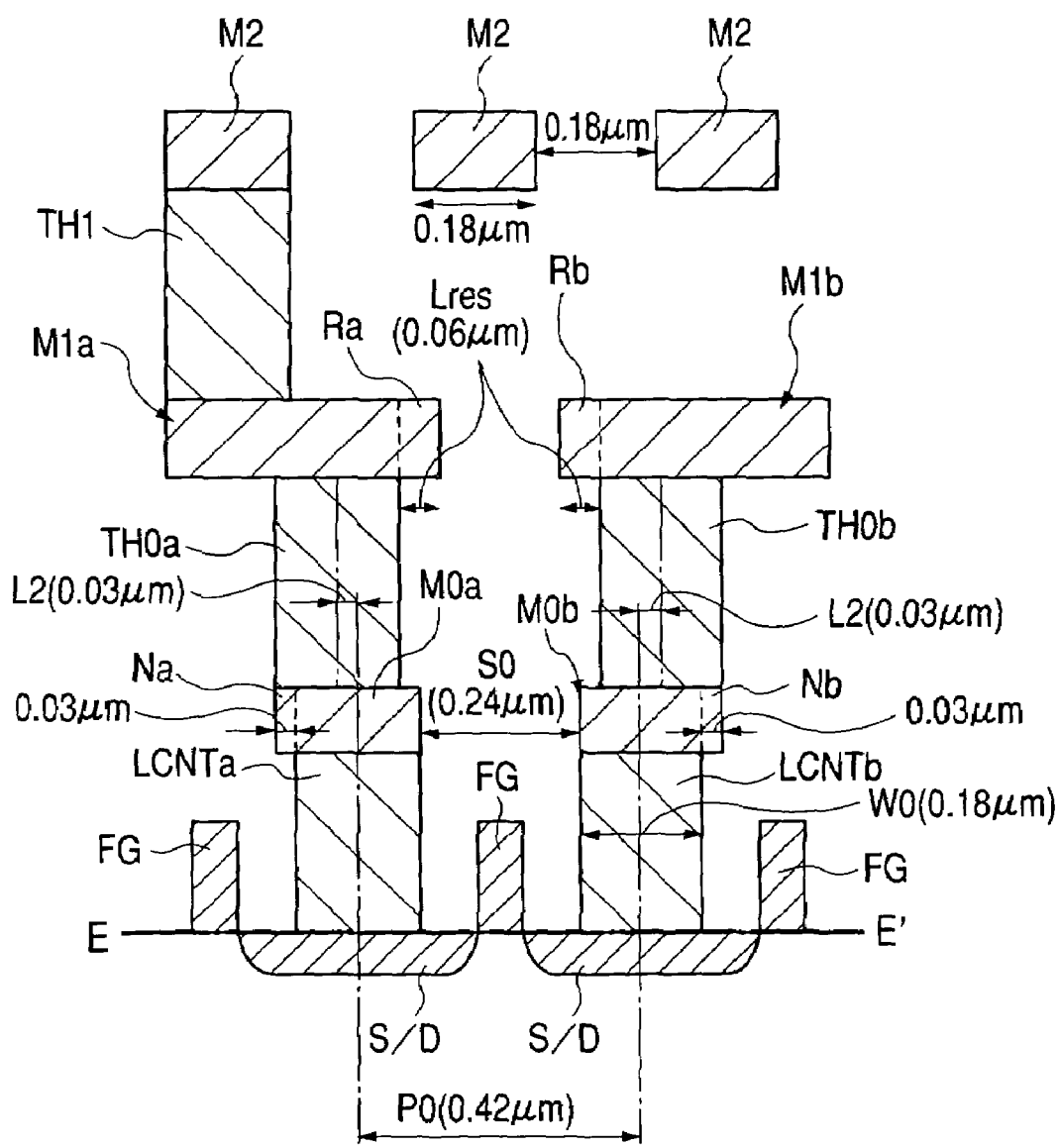
FIG. 16 is a sectional view showing a relation among wirings (M0, M1) of various layers, connections therebetween, and gate electrodes, in the third embodiment.

FIG. 15 shows a relation of the pattern between the first layer wirings M0 and a gate electrode FG of a MISFET, and FIG. 16 is a sectional view of principal portions with MISFETs underlying the 0th layer wirings M0. A section taken on line E–E' in FIG. 15 corresponds to FIG. 16.

For example, as shown in FIG. 16, P0 is 0.42 μm, S0 is 0.24 μm, W0 is 0.18 μm, and the reservoir length Lres is 0.06 μm. S1 and W1 are each 0.18 μm and P1 is 0.36 μm. The width of each second layer wiring M2 and the spacing between adjacent second layer wirings M2 are each 0.18 μm.

As shown in FIG. 12, etc., the center of the connection TH0b on the 0th layer wiring M0b is offset a distance L2 rightwards from the intersecting point of grids y2 and x1. As to the connection TH0a on the 0th layer wiring M0a, its center is offset a distance L2 leftwards from the intersecting point of y1 and x1. The distance L2 is, for example, 0.03 μm (FIG. 16).

A notch Na of the 0th layer wiring M0a is formed below the connection TH0a on the 0th layer wiring M0a, and a notch Nb of the 0th layer wiring M0b is formed below the connection TH0b on the 0th layer wiring M0b (see FIG. 13). It is preferable that the length of each of the notches Na and Nb be set equal to the distance L2. In FIG. 16, the notch length is, for example, 0.03 μm. The 0th layer wirings are spaced an allowable minimum wiring-to-wiring size or more, so even if the notches are provided, it is possible to ensure a required wiring spacing.

Thus, in this embodiment, when the first layer wirings extending in mutually opposite directions on the same grid are disposed on the 0th layer wirings of adjacent grids, the two connections on the 0th layer wirings are displaced respectively in the extending directions of the overlying first layer wirings, and notches are formed in the 0th layer wirings which underlie the thus-displaced connections.

As a result, even if reservoirs are provided in the first layer wirings, it is possible to ensure a required spacing between the first layer wirings in the X direction, and, hence, it is possible to improve the wiring mounting efficiency.

Besides, since it is possible to ensure a required spacing in the X direction between the first layer wirings disposed on the same grid, it becomes possible to dispose such other wiring as the first layer wiring M1c on grids which are adjacent to each other in the Y direction, whereby it is possible to improve the wiring freedom and, hence, improve the wiring density and mounting efficiency.

Moreover, the length of the wiring for connection between elements can be shortened, and it is possible to attain the speed-up in driving the semiconductor device, reduce the power consumption of the semiconductor device and improve the reliability thereof.

Further, by the provision of reservoirs, it is possible to improve the EM resistance and ensure a margin for pattern matching between wirings and connections. Thus, it is possible to improve the reliability of the semiconductor device.

Also in this embodiment, as in the first embodiment, the Cases 1 to 3 shown in FIG. 9 may be combined according to the degree of wiring density in each wiring layer.

Although an additional explanation will be given in paragraph (3-3) of a fourth embodiment of the present invention to be described later, it is preferable, for the optimization of the wiring layout, that the reservoir length Lres be set larger than one half of the difference between distances P0 and P1 and not larger than the difference, $[(P0-P1)/2<Lres \leq (P0-P1)]$.

The first layer wirings M1d and M1e are electrically connected to the 0th layer wirings M0a and M0b, respectively, through connections TH0d and TH0d, which connections, like the connections TH0a and TH0b, are also disposed in mutually opposite directions (away from each other) (FIG. 12).

Fourth Embodiment

In this embodiment, a description will be given of a CAD tool for realizing the wiring layout described in the third embodiment. The shape, etc. of the wiring that is provided using the CAD tool according to this embodiment is the same as the layout which has been described with reference to FIG. 12, etc. for the third embodiment, and therefore the details thereof will here be omitted.

Figure 17:
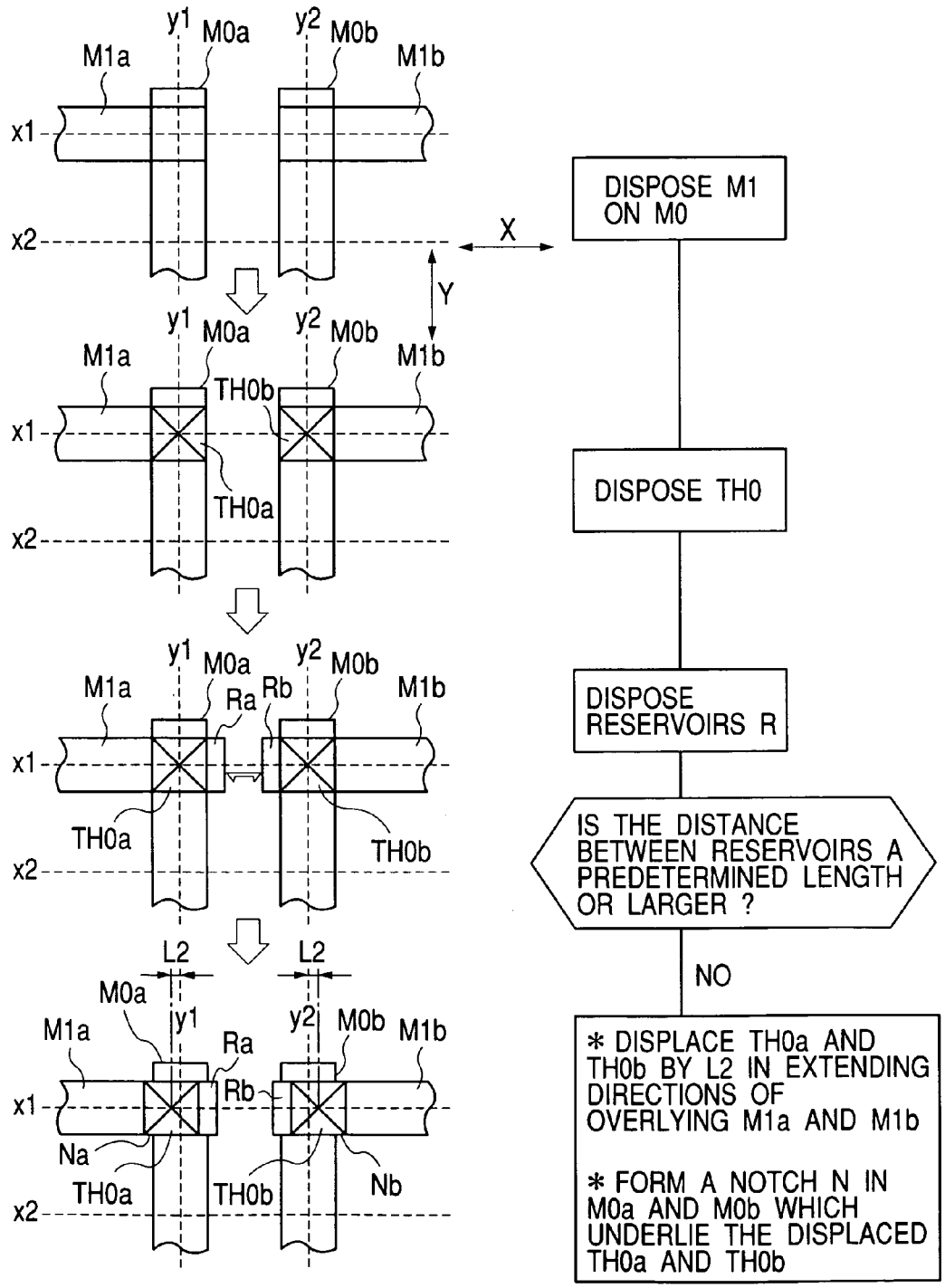
FIG. 17 is a flow chart showing a method for disposing wirings, etc. in a fourth embodiment of the present invention.

(1) With reference to FIG. 17, the following description is provided concerning a model (M0 model) in which connections TH0 and first layer wirings M1 are disposed on 0th layer wirings M0.

It is assumed that 0th layer wirings M0a and M0b have been disposed optimally in a step which precedes the step using the CAD tool.

First layer wirings M1a and M1b are disposed optimally on the 0th layer wirings M0a and M0b. Here the reservoir length is not taken into account.

Next, connections TH0a and TH0b are disposed, respectively, at intersecting points of the 0th layer wirings M0 and the first layer wirings M1.

Then, reservoirs Ra and Rb are added to the first layer wirings M1 and a check is made to see if the spacing between the two in the X direction is a predetermined length (a minimum size allowed between wirings) or more.

If the spacing is below the predetermined length, both connections TH0a and TH0b which underlie the first layer wiring M1 are displaced by a distance L2 respectively in extending directions of the first layer wirings M1, which overlie the connections. That is, adjacent connections are displaced a distance L2 in mutually opposite directions (away from each other).

Further, notches Na and Nb are added to the 0th layer wirings M0 which underlie the thus-displaced connections.

Without going through these steps, the first layer wirings M1 and the connections TH0 may be disposed using a program which permits the connections TH0 underlying the first layer wirings M1, including the reservoirs, to be offset in the extending directions of the first layer wirings M1 from intersecting points of the grids.

Figure 18:
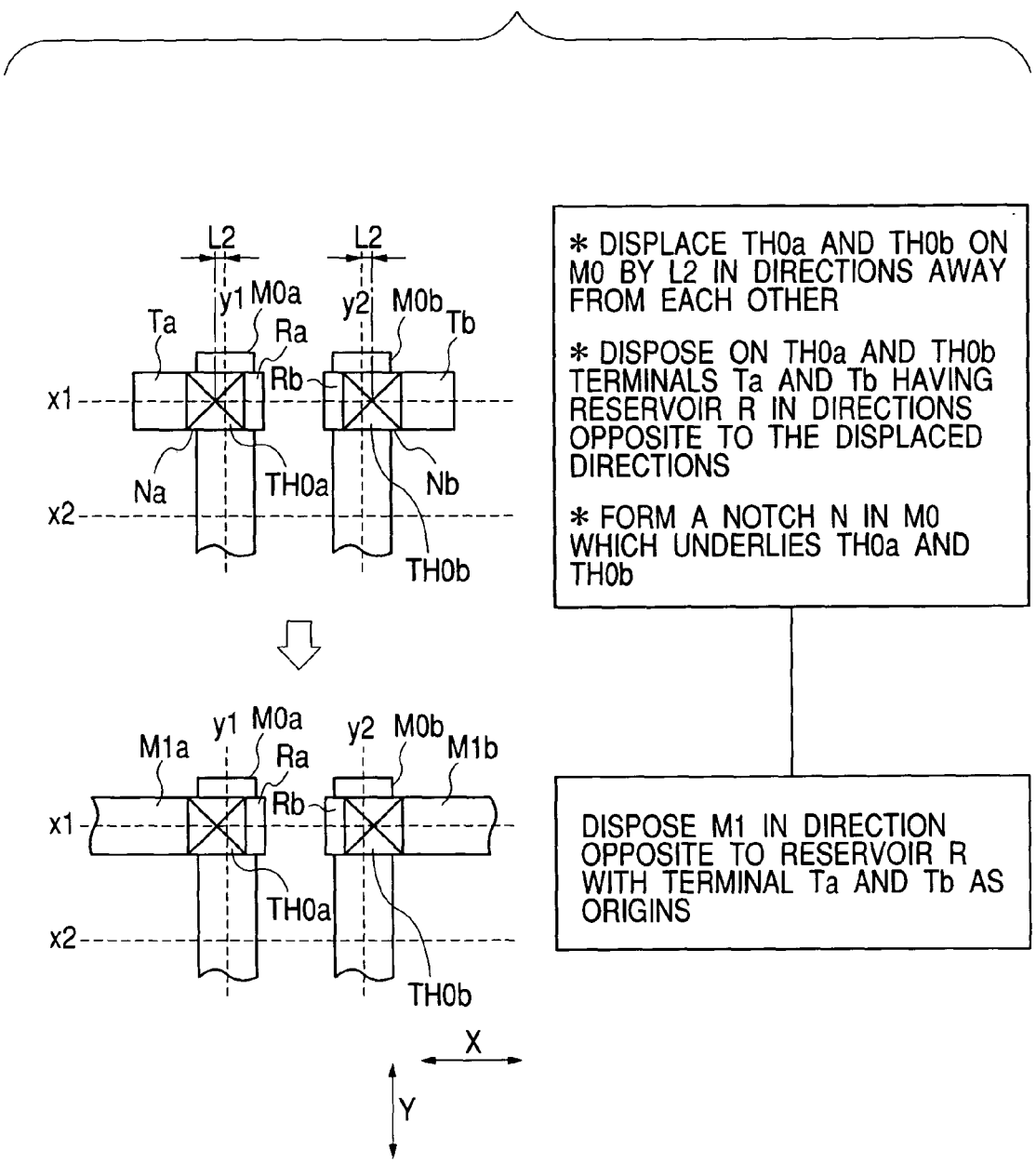
FIG. 18 is a flow chart showing another method for disposing wirings, etc. in the fourth embodiment.

(2) Next, with reference to FIG. 18, the following description is now provided concerning a model (M1 model) in which connections TH0 disposed offsetwise on the 0th layer wirings and terminals T (part of the first layer wirings M1) formed thereon are defined and the first layer wirings are disposed with the terminals T as origins.

That is, the connections TH0$a$ and TH0$b$ at points of intersection with grid x1 on the 0th layer wirings M0$a$ and M0$b$, which are disposed optimally on grids y1 and y2, respectively, are disposed in such a manner that their centers are offset leftwards and rightwards, respectively, from the intersecting points. Terminals Ta and Tb having reservoirs Ra and Rb are disposed on the connections TH0 in directions opposite to the offset directions of the connections TH0. Further, notches Na and Nb are formed in the 0th layer wirings M0$a$ and M0$b$, respectively, which underlie the displaced terminals Ta and Tb.

On the basis of positional information of the terminals Ta and Tb, the first layer wirings M1 are disposed automatically so as to extend from the terminals T in directions opposite to the reservoirs R. In other words, the first layer wirings are disposed optimally with the terminals T as origins.

Also in this M1 model, like the M1 model described in connection with the second embodiment, conditions for the layout of the first layer wirings M1 are diminished, and it is possible to shorten the TAT of the wiring design. Further, a conventional CAD system is employable.

Figure 19:
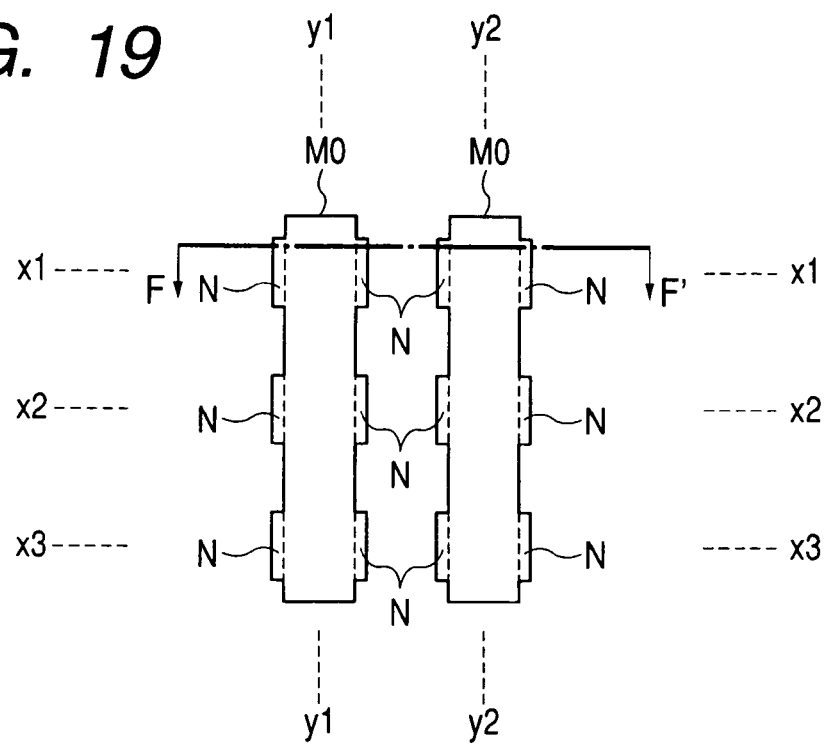
FIG. 19 is a plan view showing virtual 0th layer wiring patterns with notches formed on both sides of each intersecting point of grids.

(3) In the M0 model according to this embodiment, as shown in FIG. 19, 0th layer wirings M0 extending along grids y, with notches formed on both sides of intersecting points with grids x, may be disposed virtually and connections TH0 and first layer wirings M1 may be disposed so as to overlie the 0th layer wirings. That is, the patterns shown in FIG. 19 are set as a library (data base) in the CAD tool.

(3-1) Then, using for example the M0 model described above in (1), first layer wirings and connections TH0 are disposed. More specifically, first the first layer wirings are disposed on the patterns of the virtual 0th layer wirings M0. Here the reservoir length is not taken into account.

Next, the connections TH0 are disposed at intersecting points of the 0th layer wirings M0 and the first layer wirings M1.

Then, reservoirs are added to the first layer wirings M1 and a check is made to see if the distance between the first layer wirings M1 in the X direction is a predetermined length (a minimum size allowed between wirings) or more.

If the distance is below the predetermined length, the two connections which underlie the first layer wirings M1 are displaced in directions away from each other.

Next, there are determined patterns of 0th layer wirings having notches at overlapped pattern portions of the connections and the virtual 0th layer wirings M0. In other words, out of the notches of the virtual 0th layer wirings M0, only those that underlie the connections are determined to be normal (actual) notches.

(3-2) When disposing the first layer wirings M1 on the patterns of the 0th layer wirings that are virtually provided with notches, if the extending directions of the first layer wirings M1 and the positions of the grids xy, at which the connections TH0 are to be disposed, are determined beforehand, the connections TH0 will be disposed while being displaced onto the notches automatically.

To be more specific, if such a wiring layout as shown in FIG. 12, which has been described with reference to the previous third embodiment, is to be adopted, and if the first layer wirings M1$a$ and M1$b$ are connected respectively to the connection TH0$a$ disposed at an intersecting point of grids x1 and y1 and to the connection TH0$b$ disposed at an intersecting point of grids x1 and y2 from the left-hand side of the connection TH0$a$ and from the right-hand side of the connection TH0$b$, respectively, the connection TH0$a$ is formed while being offset in the extending direction of the first layer wiring M1$a$ and the connection TH0$b$ is formed while being offset in the extending direction of the first layer wiring M1$b$.

Then, reservoirs Ra and Rb are added to the first layer wirings M1. In this case, since the connections TH0$a$ and TH0$b$ are formed offsetwise as described above, a required wiring spacing is ensured between the reservoirs Ra and Rb.

Thus, if a rule (algorithm) for layout is established, then at the time of making a layout with use of an automatic wiring tool, there will be no wiring error and it is possible to ensure a required spacing between the first layer wirings disposed on the same grid.

(3-3) As to the reservoir length, it is preferable to adopt a layout using Case 2 shown in FIG. 9. If Case 3 is used, the width of the displacement of the connections TH0 becomes larger, so that the length of the notches N formed on both sides of each 0th layer wiring M0 also becomes larger, with consequent occurrence of a wiring error in the 0th layer wirings M0. That is, if Case 3 is used, it is impossible to provide virtual notches N on both sides of each 0th layer wiring M0, and, therefore, the wiring freedom is lost. On the other hand, in Case 2, even if virtual notches N are formed on both sides of each 0th layer wiring M0, there is no fear of occurrence of a wiring error, so that it is possible to enhance the freedom in wiring layout.

Thus, by virtually disposing the 0th layer wirings having notches at all the intersecting points of the grids, it is possible to use an automatic wiring tool which satisfies the general condition of "disposing connections TH0 on the 0th layer wirings M0."

That is, in an existing automatic wiring tool, there are not a few cases wherein, if it is impossible to dispose connections on underlying wiring patterns, an error results. However, if such a library as described above is provided, even if connections are displaced to any grid intersecting points, there is no fear that an error may occur, and, hence, it becomes possible to select a suitable automatic wiring tool in a wider range.

Figure 20:
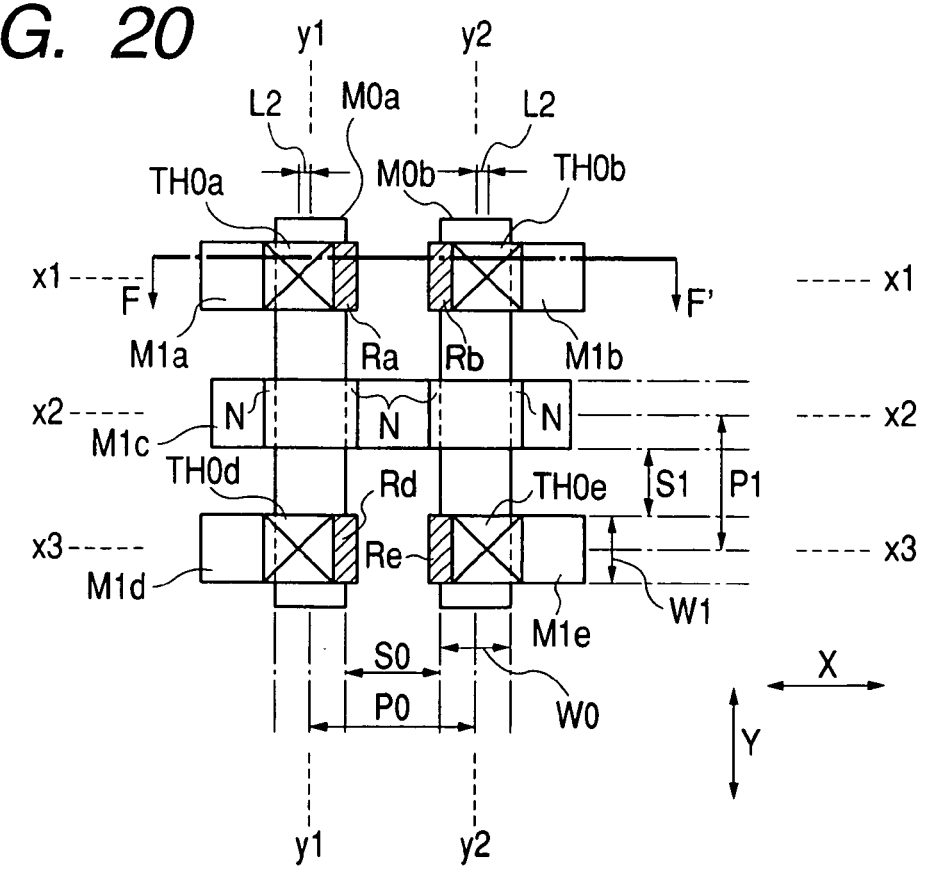
FIG. 20 is a plan view showing planar patterns of wirings (M0, M1) of other various layers and those of connections formed between the wirings in the fourth embodiment.
Figure 21:
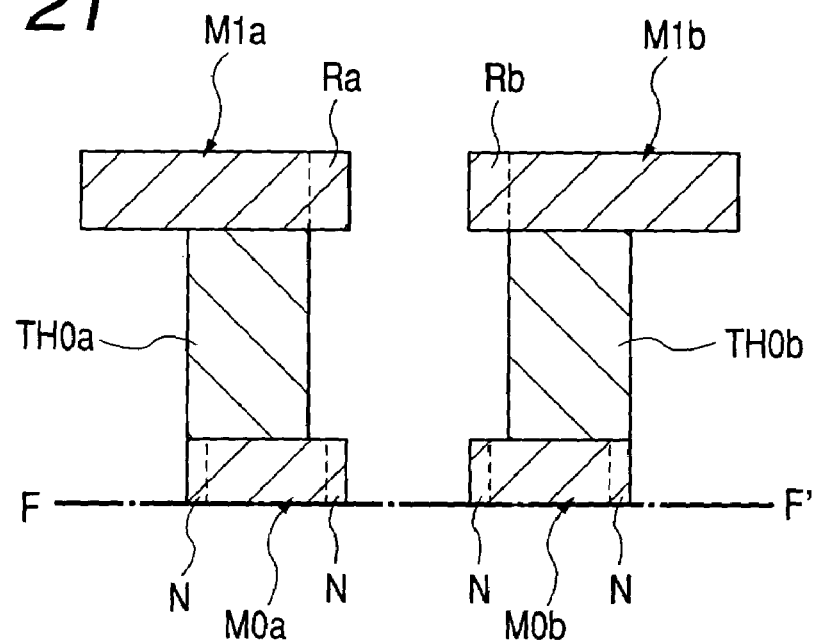
FIG. 21 is a sectional view of principal portions taken on line F–F' in FIG. 20.

Of course, the patterns shown in FIG. 19 may be used as the patterns of the 0th layer wirings M0 irrespective of whether connections TH0 are formed thereon. In this connection, FIG. 20 is a plan view showing planar patterns of the 0th layer wirings M0$a$, M0$b$, the first layer wirings M1$a$ to M1$e$, and the connections TH0$a$, TH0$b$ between the 0th and first layer wirings, and FIG. 21 is a sectional view of principal portions taken on line F–F' in FIG. 20.

In this case, however, the patterns of the 0th layer wirings M0 become complicated and it becomes difficult to resolve a resist film in the formation of wiring patterns. Besides, the wiring area becomes larger, with a consequent increase of the wiring capacitance.

Therefore, it is preferable that the notches of the 0th layer wirings be provided only under the connections TH0.

Using the patterns shown in FIG. 19 as a library (data base), it is possible to use the wiring method described in connection with the second embodiment.

Fifth Embodiment

The following description is directed to an example in which the wiring method described in connection with the first or the second embodiment is applied to a specularly disposed two-input NAND cell (hereinafter referred to as "2NAND cell").

Figure 22:
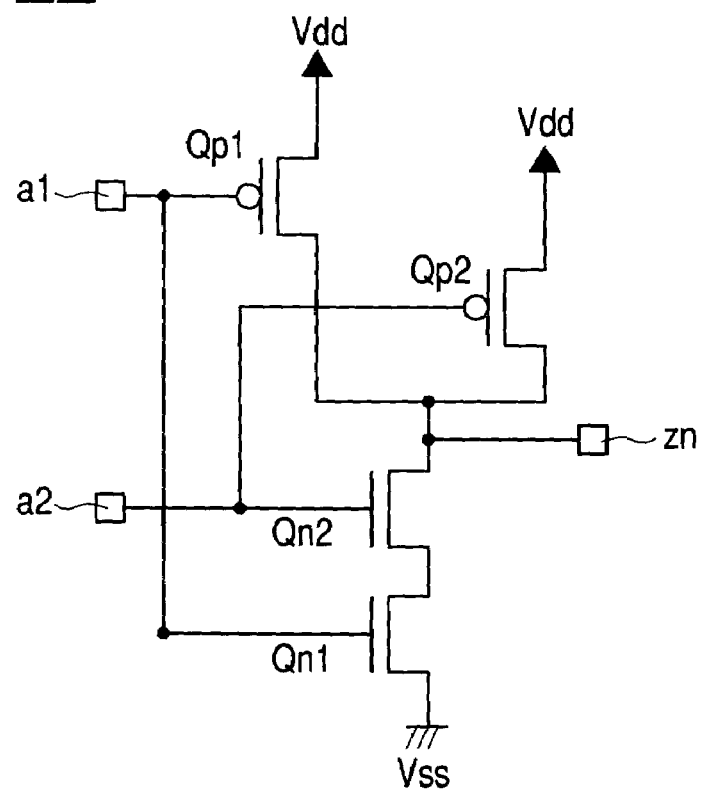
FIG. 22 is a circuit diagram of a two-input NAND cell.

(1) First, reference will be made to FIG. 22, which is a circuit diagram of a 2NAND cell. As shown in the figure, an input terminal a1 is connected to gate electrodes of a p-channel MISFET Qp1 and an n-channel MISFET Qn1, while an input terminal a2 is connected to gate electrodes of a p-channel MISFET Qp2 and an n-channel MISFET Qn2. Between an output terminal zn and a supply voltage (Vdd), the p-channel MISFETs Qp1 and Qp2 are connected in parallel, while the n-channel MISFETs Qn2 and Qn1 are successively connected in series between an output terminal zn and an earth voltage (reference voltage Vss).

(2) Next, a description will be given below of the structure of the specularly disposed 2NAND cell, as well as a method of fabricating the same.

Figure 25:
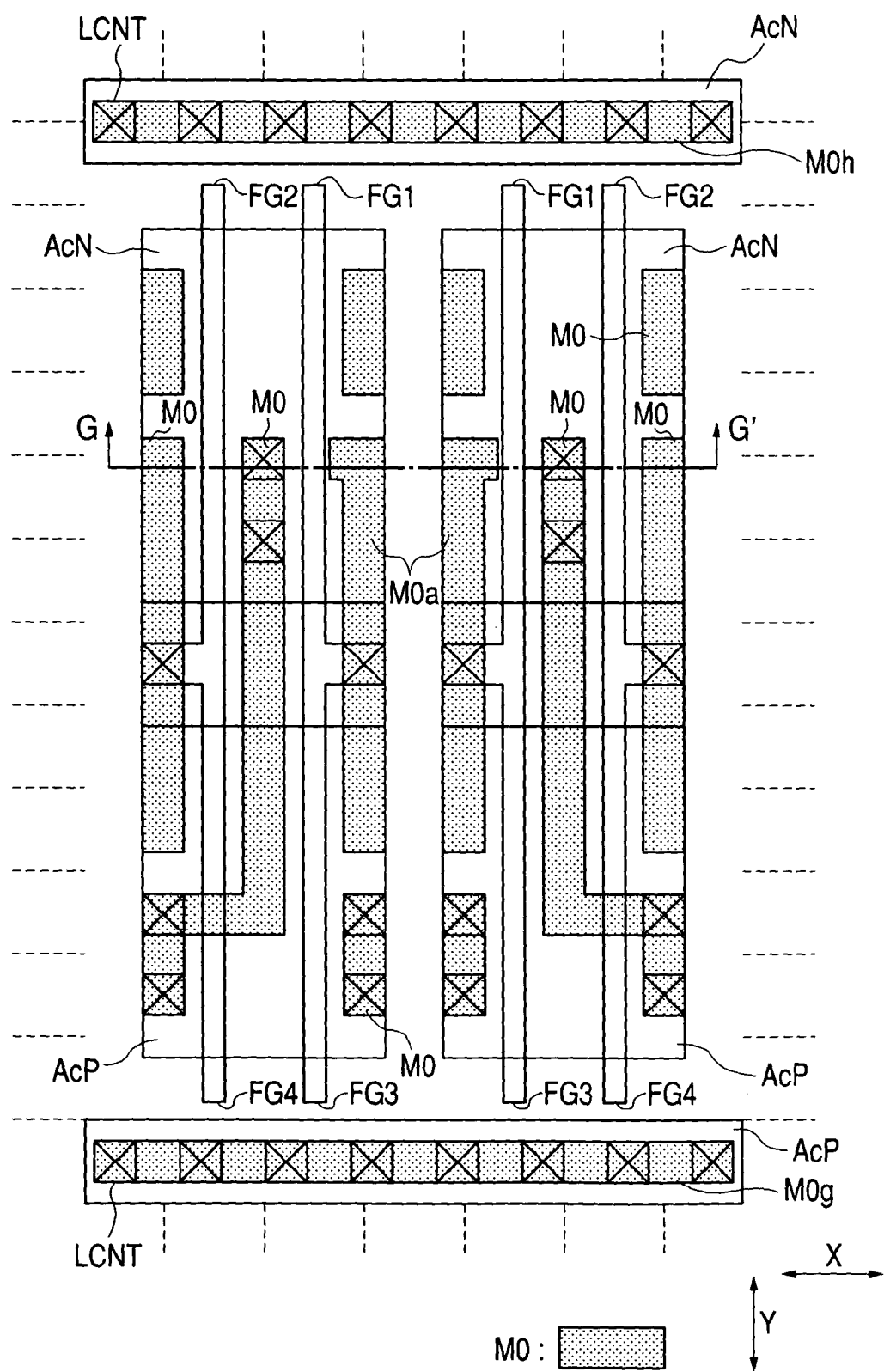
FIG. 25 is a plan view showing a pattern layout of various layers which constitute the two-input NAND cell in the fifth embodiment.
Figure 26:
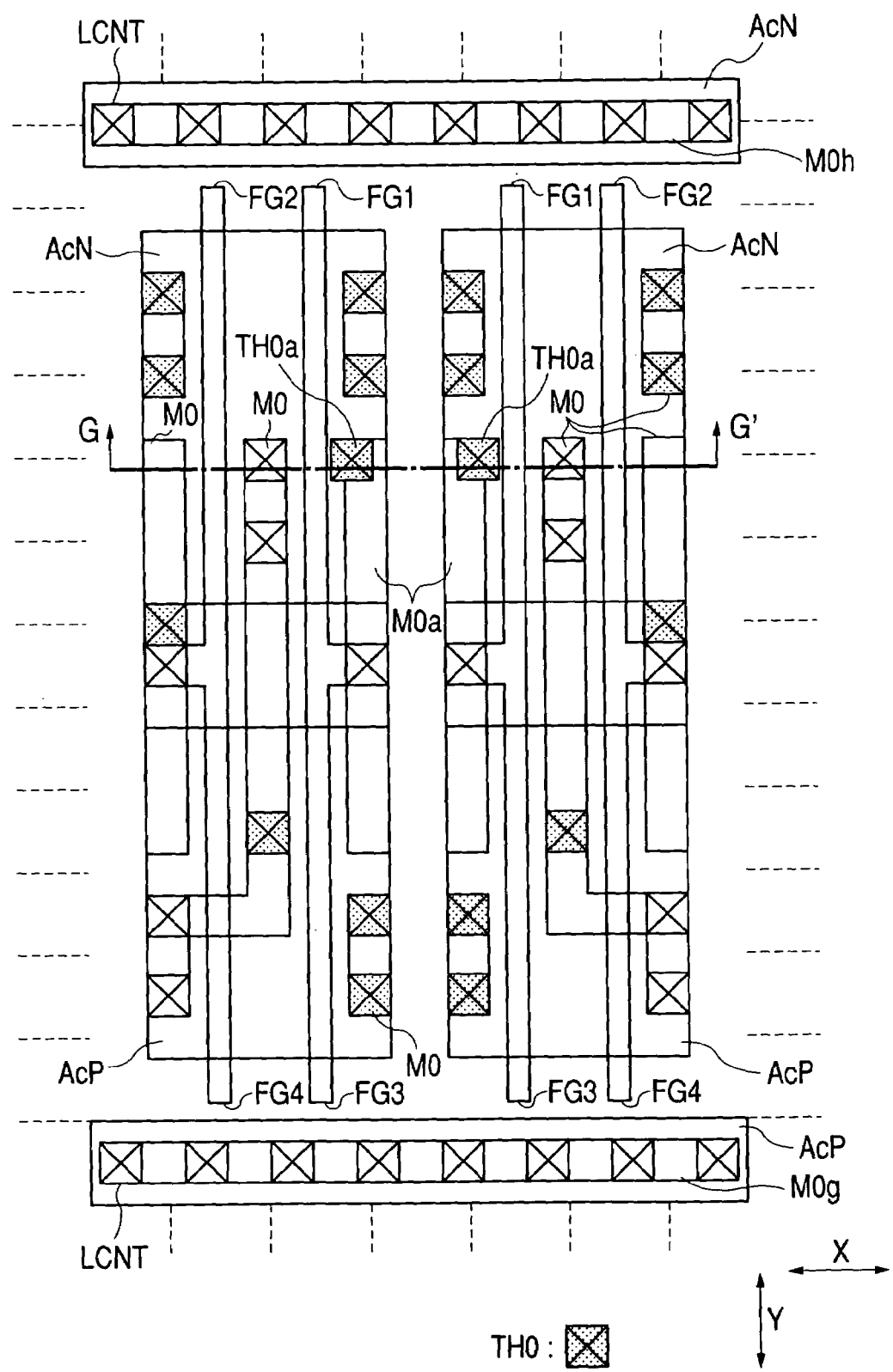
FIG. 26 is a plan view showing a pattern layout of various layers which constitute the two-input NAND cell in the fifth embodiment.
Figure 27:
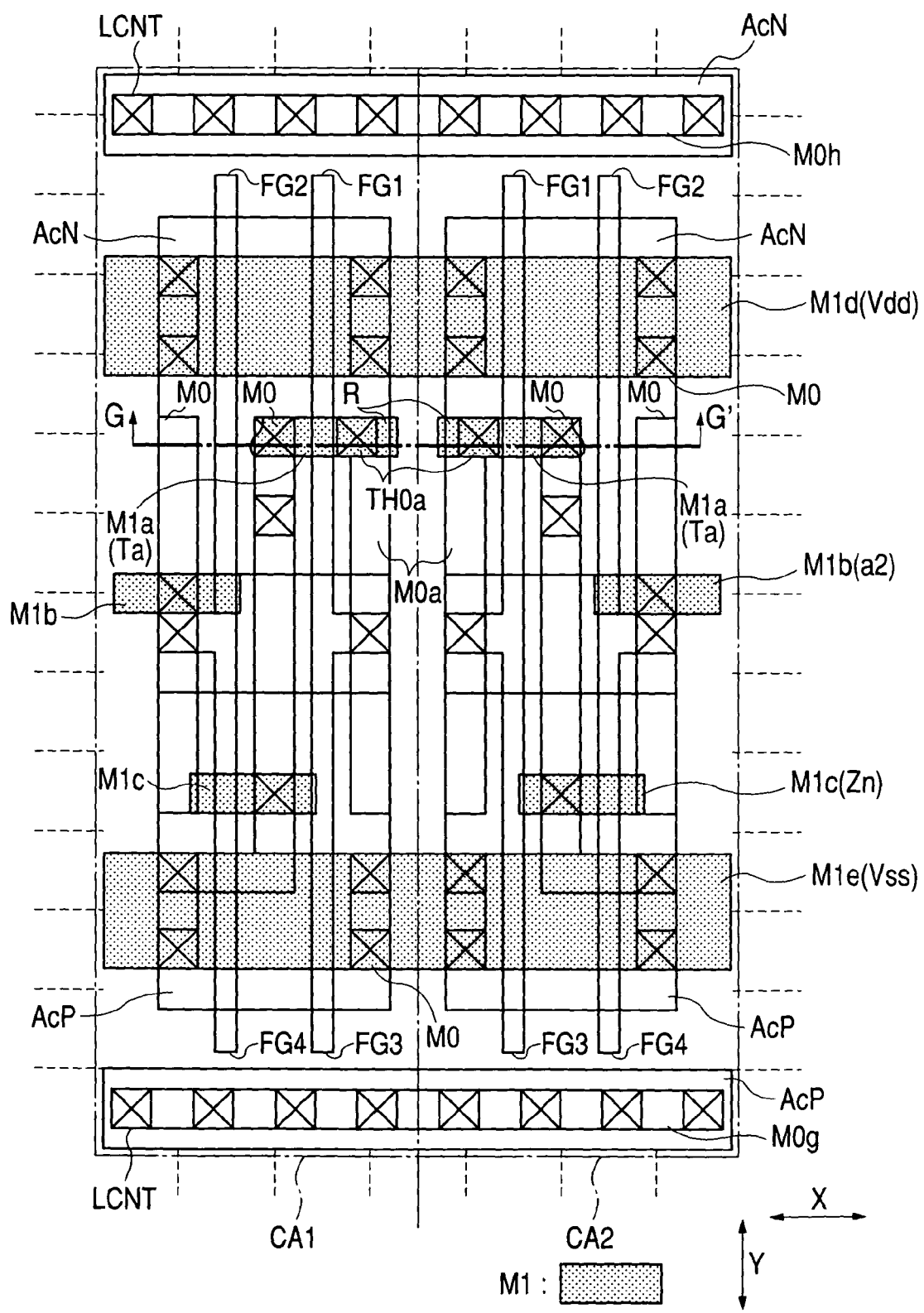
FIG. 27 is a plan view showing a pattern layout of various layers which constitute the two-input NAND cell in the fifth embodiment.
Figure 28:
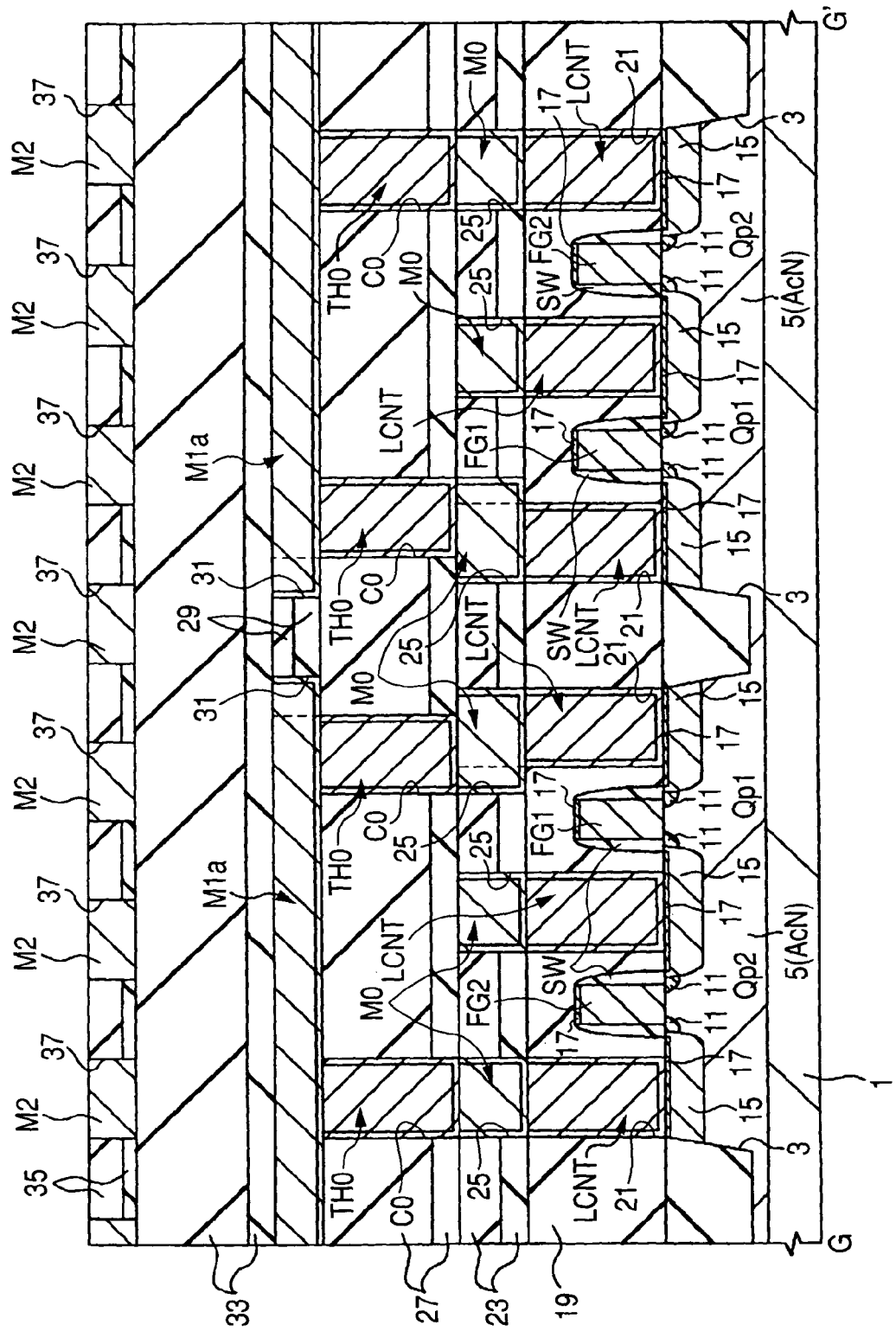
FIG. 28 is a sectional view taken on line G–G' in FIG. 27.

FIGS. 23 to 27 are plan views each showing a pattern layout of various layers which constitute the 2NAND cell and FIG. 28 is a sectional view taken on line G–G' of the plan views. As shown in FIG. 27, the 2NAND cell is formed in cell areas CA1 and CA2, which are disposed symmetrically with respect to a line which defines the cell areas and which extends in the Y direction.

Figure 23:
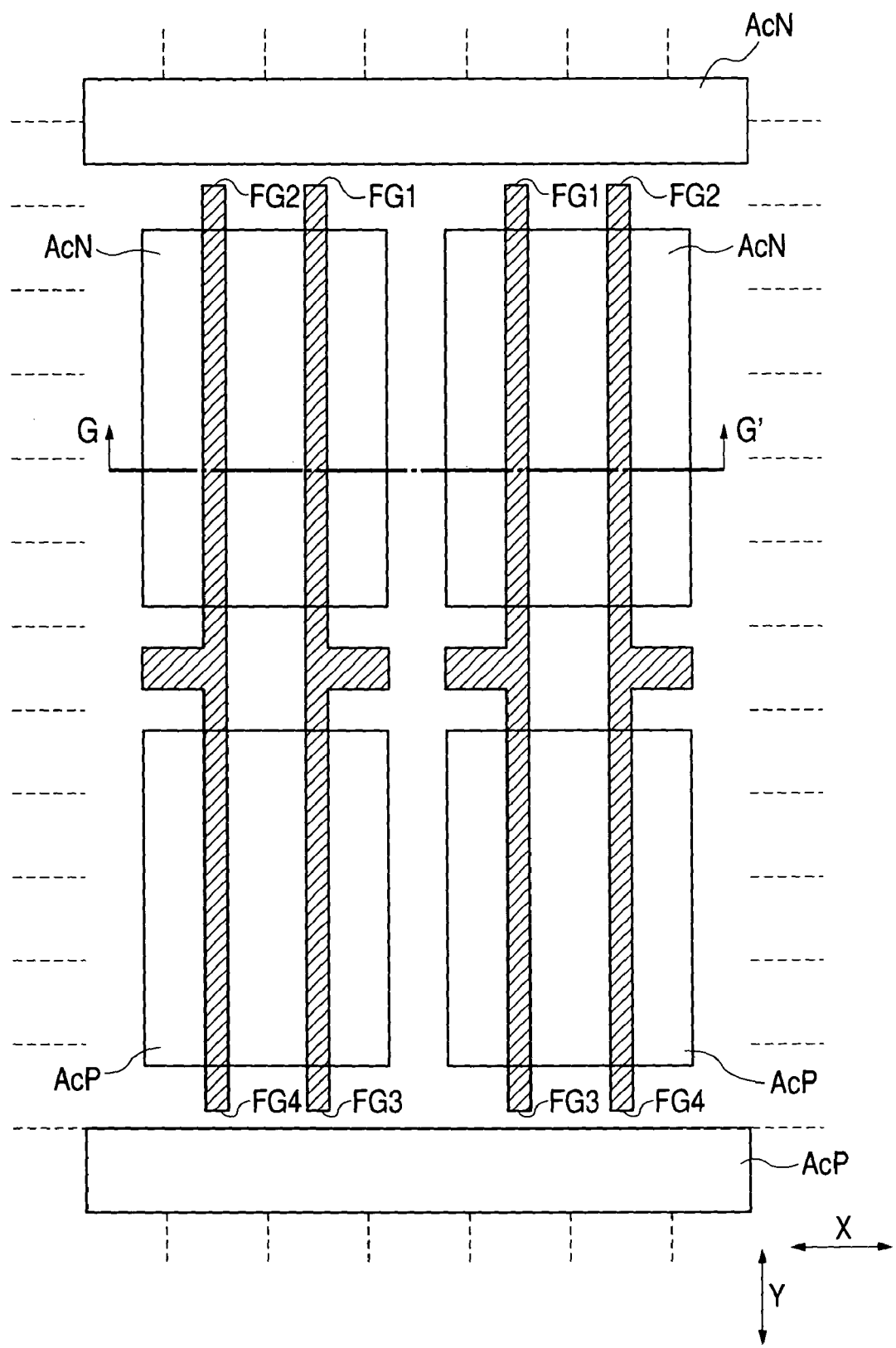
FIG. 23 is a plan view showing a pattern layout of various layers which constitute a two-input NAND cell in a fifth embodiment of the present invention.

As shown in FIGS. 23 and 28, for example, a silicon oxide film serving as an insulating film is buried into a trench formed in a semiconductor substrate 1 to form isolation 3. Then, n and p type impurities are implanted and diffused into the semiconductor substrate 1 to form an n type well 5 and a p type well. An exposed area of the n type well 5 and that of the p type well are assumed to be active AcN and AcP, respectively.

Next, for example an impurity-doped polycrystalline silicon film serving as a conductive film is deposited on the semiconductor substrate 1, followed by patterning, to form gate electrodes FG. Of the gate electrodes FG, FG1 and FG2 extend in the Y direction on active can, and FG3 and FG4 extend in the Y direction on active AcP. FG1 is a gate electrode of Qp1, FG2 is a gate electrode of Qp2, FG3 is a gate electrode of Qn1, and FG4 is a gate electrode of Qn2. FG1 and FG3 are interconnected through a wiring portion formed by the aforesaid polycrystalline silicon film, and FG2 and FG4 are also connected in the same manner.

Next, an n type impurity is implanted into the semiconductor substrate (p type well) on both sides of each gate electrode FG to form n⁻ type semiconductor regions. Likewise, a p type impurity is implanted into the semiconductor substrate 1 (n type well) on both sides of each gate electrode to form p⁻ type semiconductor regions 11.

Then, a silicon nitride film serving as an insulating film is deposited onto each gate electrode FG, followed by anisotropic etching, to form side wall films SW on side walls of each gate electrode FG.

Next, using the gate electrode and the side wall films as a mask, an n type impurity is implanted into the semiconductor substrate 1 (p type well) on both sides of the gate electrode to form an n⁺ type semiconductor region serving as a source-drain region of the n-channel type MISFET. Likewise, a p type impurity is implanted into the semiconductor substrate (n type well) on both sides of the gate electrode to form a p⁺ type semiconductor region 15 serving as a source-drain region of the p-channel type MISFET.

Then, for example a cobalt film serving as a refractory metal film is deposited on the semiconductor substrate 1 and is heat-treated for reaction with the silicon which constitutes the semiconductor substrate, to form a cobalt silicide film 17 at contact portions of the cobalt film with the semiconductor substrate 1 and the gate electrodes FG.

Next, the unreacted cobalt film is removed, and, for example, a silicon oxide film 19 serving as an insulating film is deposited on the semiconductor substrate 1.

Figure 24:
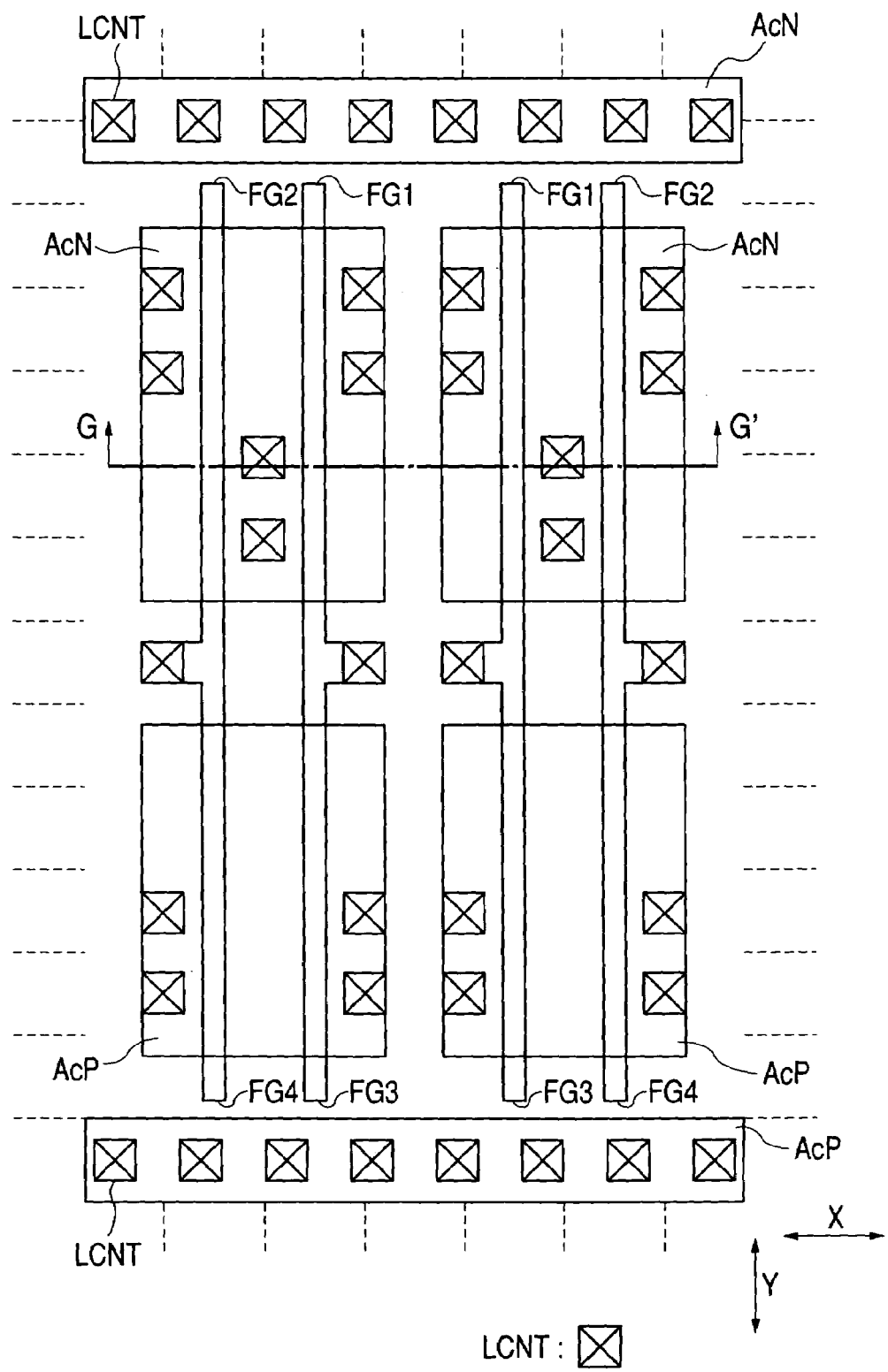
FIG. 24 is a plan view showing a pattern layout of various layers which constitute the two-input NAND cell in the fifth embodiment.

Then, as shown in FIGS. 24 and 28, the silicon oxide film 19 is removed selectively to form contact holes 21 on the source-drain regions of the MISFETs or on the gate electrodes.

Next, for example, a TiN (titanium nitride) film serving as a barrier film is deposited as a thin film on the silicon oxide film 19, including the interiors of the contact holes 21, and a W (tungsten) film serving as a conductive film is deposited thereon to such an extent as to fill up the contact holes 21.

Then, the TiN film and the W film present outside the contact holes 21 are removed by a CMP (Chemical Mechanical Polishing) method, for example, to form connections (plugs) LCNT.

Next, as shown in FIGS. 25 and 28, for example, a silicon nitride film is deposited on the silicon oxide film 19 and a silicon oxide film is further deposited thereon to form an insulating film 23 for wiring trenches constituted by the thus-deposited laminate film. The silicon nitride film serves as an etching stopper at the time of forming the wiring trenches.

Then, the insulating film 23 is removed selectively to form wiring trenches 25. Subsequently, a single layer film, such as a TiN film, Ta film, or TaN film, serving as a barrier film, or a laminate film of those films, is deposited on the insulating film 23, including the interiors of the wiring trenches 25, and further a W or copper (Cu) film serving as a conductive film is deposited thereon to such an extent as to fill up the wiring trenches 25.

Next, the barrier film and the conductive film present outside the wiring trenches 25 are removed by CMP, for example, to form 0th layer wirings M0.

The 0th layer wirings M0 are formed in the Y direction along grids y, provided they include a portion extending in the X direction. Further, gate electrodes FG are positioned between the 0th layer wirings M0. Grids are represented by broken lines in plan view. It is assumed that grids located in the X direction are grids x and those located in the Y direction are grids y.

Then, an insulating film 27 constituted, for example, by a laminate film of a silicon nitride film and a silicon oxide film is deposited on the insulating film 23.

Next, as shown in FIGS. 26 and 28, the insulating film 27 is removed selectively to form contact holes C0. Subsequently, for example, a TiN film serving as a barrier film is deposited as a thin film on the insulating film 27, including the interiors of the contact holes C0, and further a W film serving as a conductive film is deposited thereon to such an extent as to fill up the contact holes C0. Thereafter, like the connections LCNT, connections TH0 are formed by burying a TiN film and a W film into the contact holes C0.

Then, as shown in FIGS. 27 and 28, an insulating film 29 constituted, for example, by a laminate film of a silicon nitride film and a silicon oxide film is deposited on the insulating film 27 and wiring trenches 31 are formed like the wiring trenches 25.

Next, for example, a TiN film serving as a barrier film is deposited as a thin film on the insulating film 29, including the interiors of the wiring trenches 31, and a Cu (copper) film serving as a conductive film is formed thereon to such an extent as to fill up the wiring trenches 31 by, for example, a plating method or a sputtering method. Subsequently, the TiN film and Cu film present outside the wiring trenches 31 are removed by CMP, for example, to form first layer wirings M1.

As shown in FIG. 27, the first layer wirings M1 are formed on grids x in the X direction.

Of the first layer wirings M1, M1a corresponds to the input terminal a1, M1b corresponds to the input terminal a2, M1c corresponds to the output terminal zn, M1d is supplied with the supply voltage (Vdd), and M1e is supplied with the earth voltage (Vss). Of the 0th layer wirings M0, M0h is connected to a power supply portion of the n type well (AcN), while M0g is connected to a power supply portion of the p type well (AcP).

The first layer wiring M1a in the cell area CA2 extends rightwards, i.e., in a direction away from a cell boundary region, from above the connection TH0a on the 0th layer wiring M0a, while the first layer wiring M1a in the cell area CA1 extends leftwards from above the connection TH0a on the 0th layer wiring M0a. Both wirings are disposed so as to be positioned on the same grid.

More specifically, the connection TH0 which underlies the first layer wiring M1a in the cell area CA2 is displaced rightwards (rightward displacement) from the center of the 0th layer wiring M0a, i.e., in a direction away from the cell boundary region, while the connection TH0a which underlies the first layer wiring M1a in the cell area CA1 is displaced leftwards (leftward displacement) from the center of the 0th layer wiring M0a. The other connections TH0 are disposed centrally of the 0th layer wirings M0.

By thus setting the layout of the cell area CA2, the specularly disposed cell area CA1 assumes a layout corresponding to a folded-back layout of the cell area CA2 with respect to the cell boundary region. The connection TH0a in the cell area CA1 is offset from the center of the 0th layer wiring M0a in a direction away from the cell boundary region and therefore the connection TH0a in the cell area CA2 is also offset from the center of the 0th layer wiring M0a in a direction away from the cell boundary region. With such a layout, it is possible to ensure a required wiring spacing in the X direction.

Thereafter, as shown in FIG. 28, insulating films 33 and 35 are deposited to form second layer wirings M2 in wiring trenches 37.

The cell structure shown in FIGS. 17 and 28 can be realized, for example, by the automatic wiring layout of the M1 model described in connection with the second embodiment, etc.

That is, the connection TH0a in the cell area CA2 is offset rightwards beforehand, while the connection TH0a in the cell area CA1 is beforehand offset leftwards, and on these connections are provided terminals Ta with reservoirs R set in directions opposite to the offset directions of the connections. The cell area CA1 is disposed specularly, then with this as an origin, the first layer wirings M1 are disposed optimally (see FIG. 27).

In the case where, using the M0 model, the connections TH0a which underlie the first layer wirings M1 are disposed so as to be adjacent to each other on the same grid x at the cell ends, it is possible to dispose them so as to be offset in mutually opposite directions (away from each other), thereby ensuring reservoir regions R.

Sixth Embodiment

The following description is directed to an example in which the wiring method described in connection with the first to the fourth embodiments is applied to a four-input NAND cell (hereinafter referred to as "4NAND cell").

Figure 29:
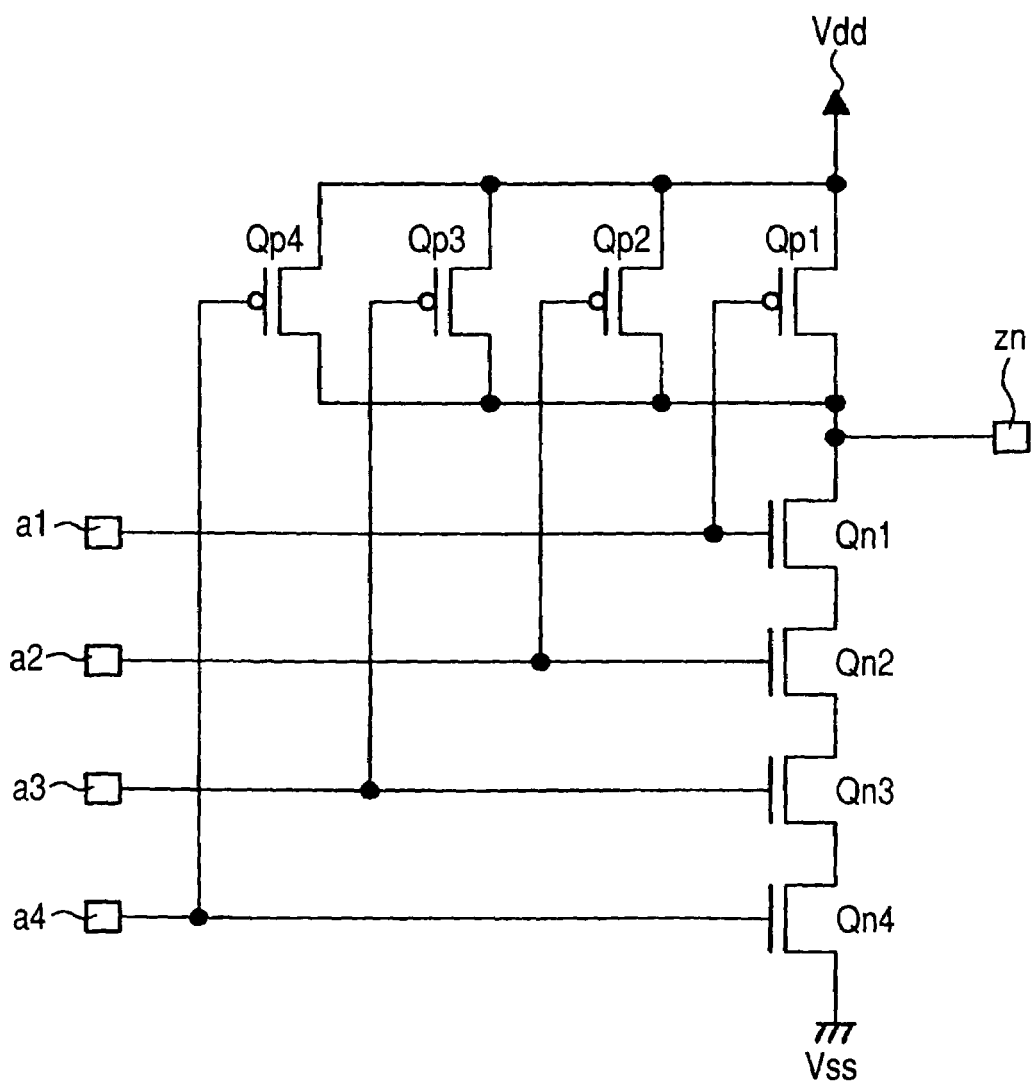
FIG. 29 is a circuit diagram of a four-input NAND cell.

(1) The description will be directed first to a 4NAND cell. FIG. 29 is a circuit diagram of a 4NAND cell. As shown in the figure, an input terminal a1 is connected to gate electrodes of a p-channel MISFET Qp1 and that of an n-channel MISFET Qn1. Likewise, input terminals a2 to a4 are connected respectively to gate electrodes of p-channel MISFETs Qp2 to Qp4 and also to gate electrodes of n-channel MISFETs Qn2 to Qn4. Between an output terminal zn and a supply voltage (Vdd), p-channel MISFETs Qp1 to Qp4 are connected in parallel, while n-channel MISFETs Qn1 to Qn4 are successively connected in series between the output terminal zn and an earth voltage (Vss).

(2) Wirings, etc. which constitute the 4NAND cell can be formed in the same way as in the fifth embodiment, although their patterns are different, and so a detailed description will be given concerning the patterns of various layers.

FIGS. 30 to 35 are plan views showing pattern layouts of various layers which constitute the 4NAND cell.

Figure 30:
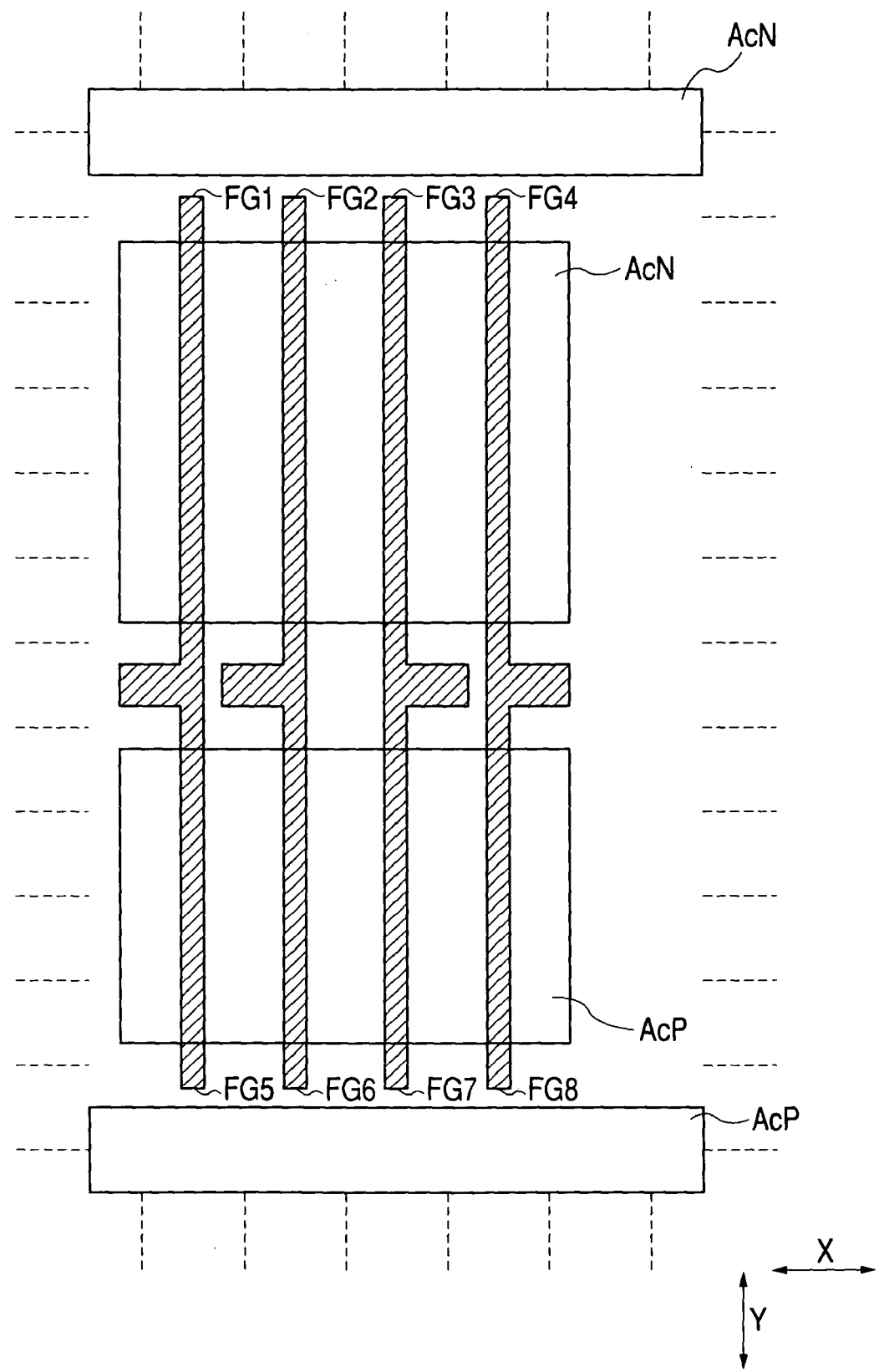
FIG. 30 is a plan view showing a pattern layout of various layers which constitute a four-input NAND cell in a sixth embodiment of the present invention.

As shown in FIG. 30, the gate electrodes FG1 to FG4 extend in the Y direction on active AcN, while gate electrodes FG5 to FG8 extend in the Y direction on active AcP.

Figure 31:
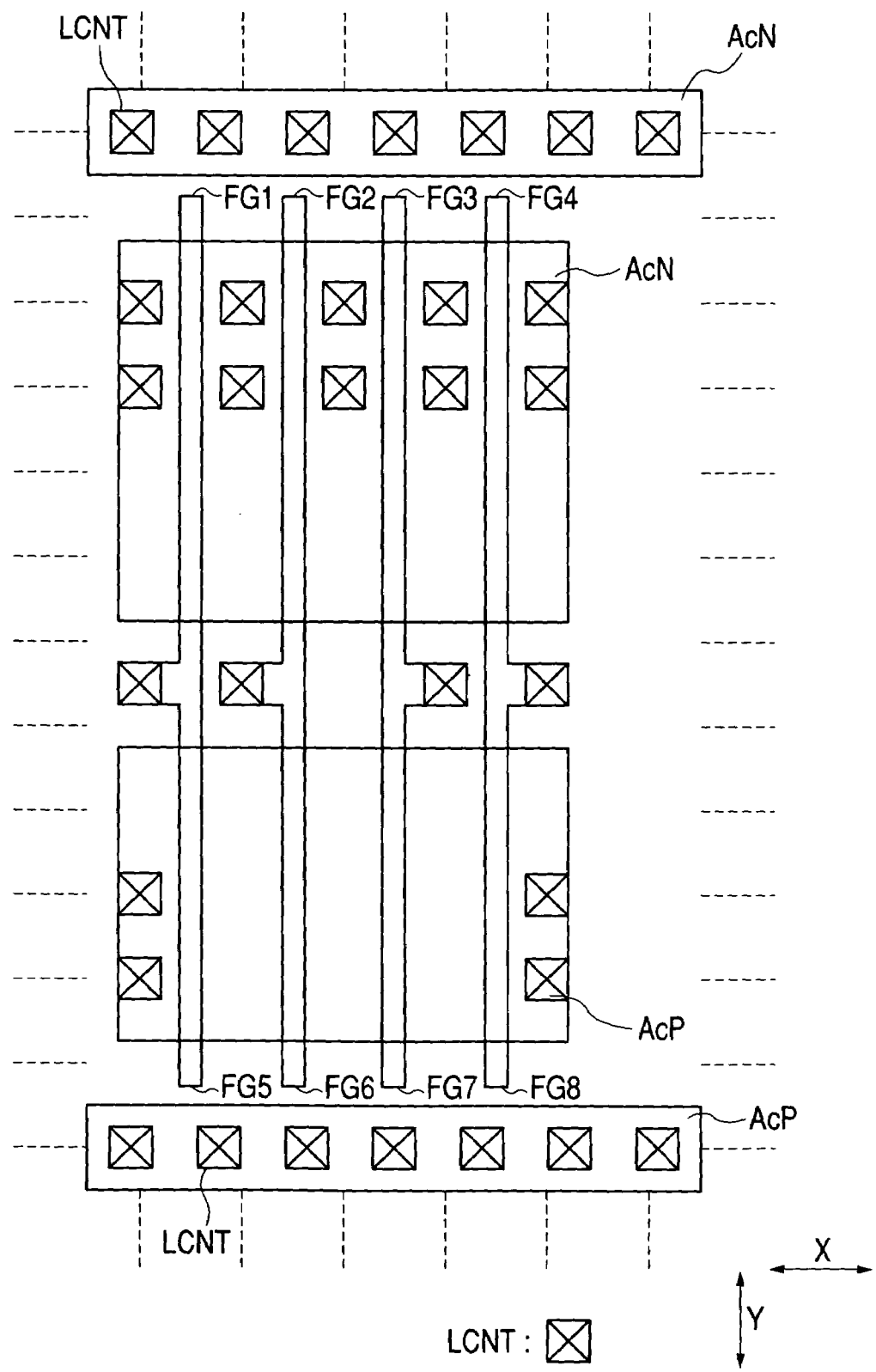
FIG. 31 is a plan view showing a pattern layout of various layers which constitute the four-input NAND cell in the sixth embodiment.

The gate electrodes FG1 and FG5, FG2 and FG6, FG3 and FG7, and FG4 and FG8, are respectively connected together by wiring portions formed by the same layer of polycrystalline silicon film as the gate electrodes. Further, connections LCNT are disposed at desired positions on both sides of the gate electrodes FG (FIG. 31).

Figure 32:
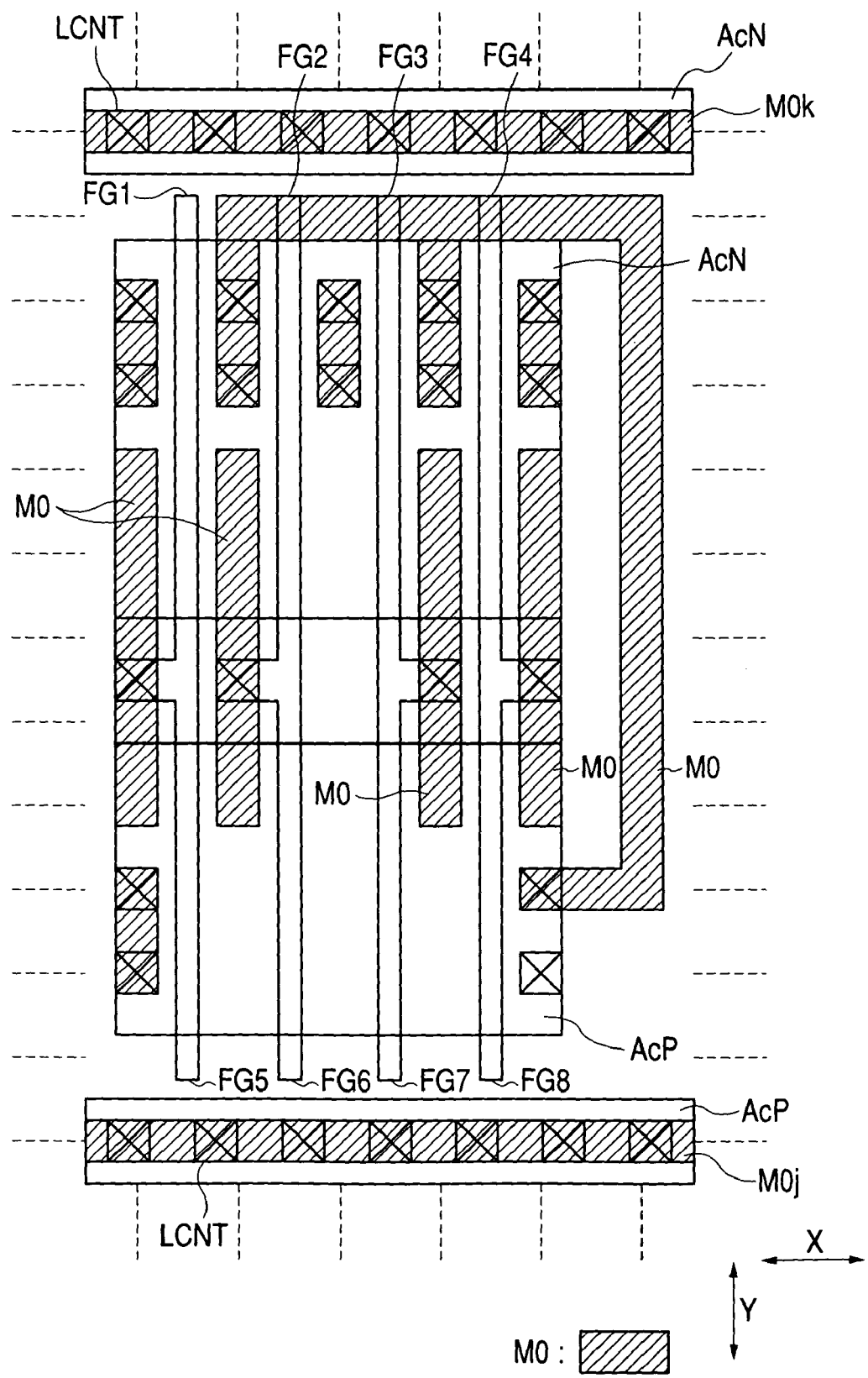
FIG. 32 is a plan view showing a pattern layout of various layers which constitute the four-input NAND cell in the sixth embodiment.
Figure 33:
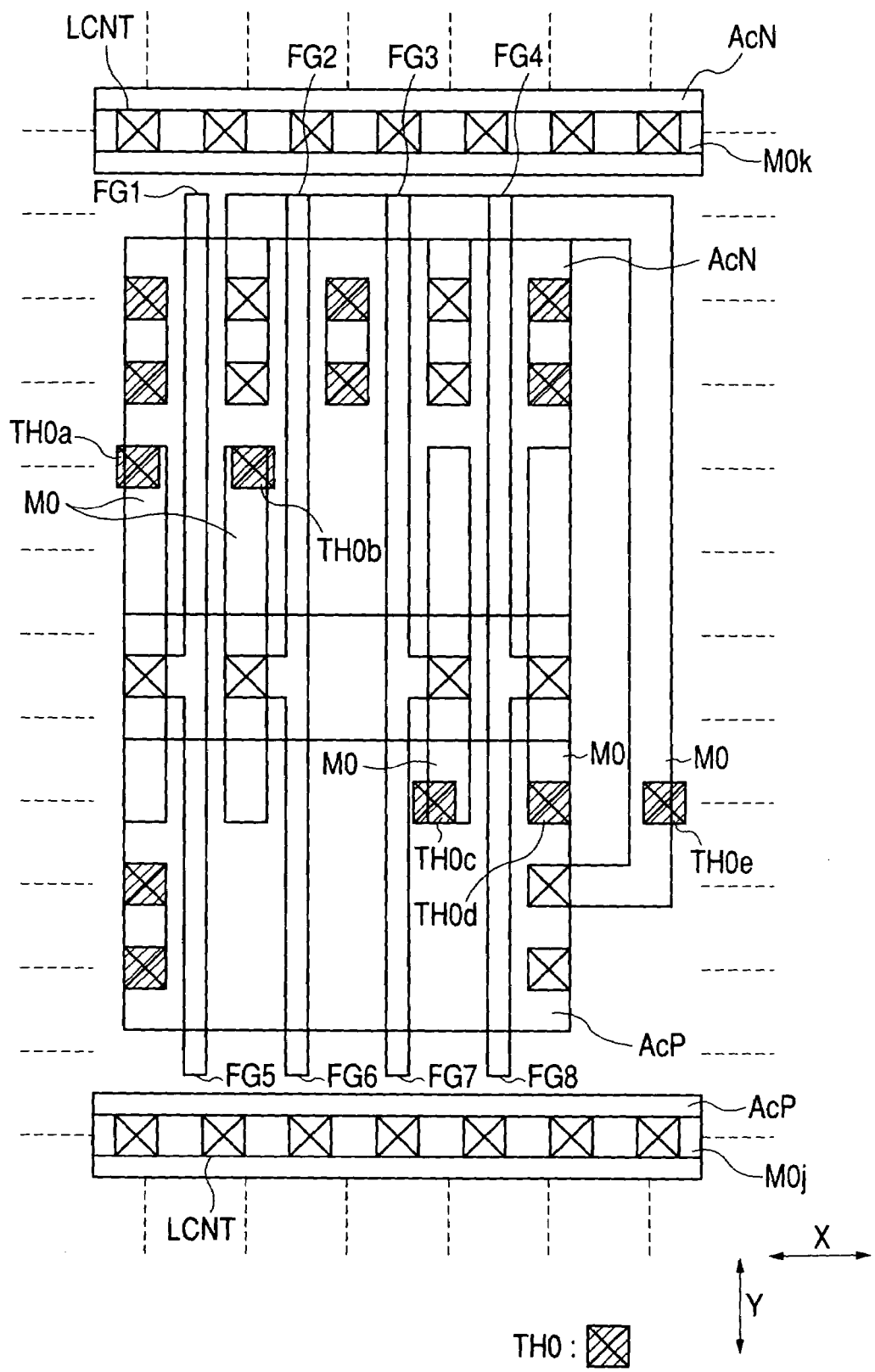
FIG. 33 is a plan view showing a pattern layout of various layers which constitute the four-input NAND cell in the sixth embodiment.
Figure 34:
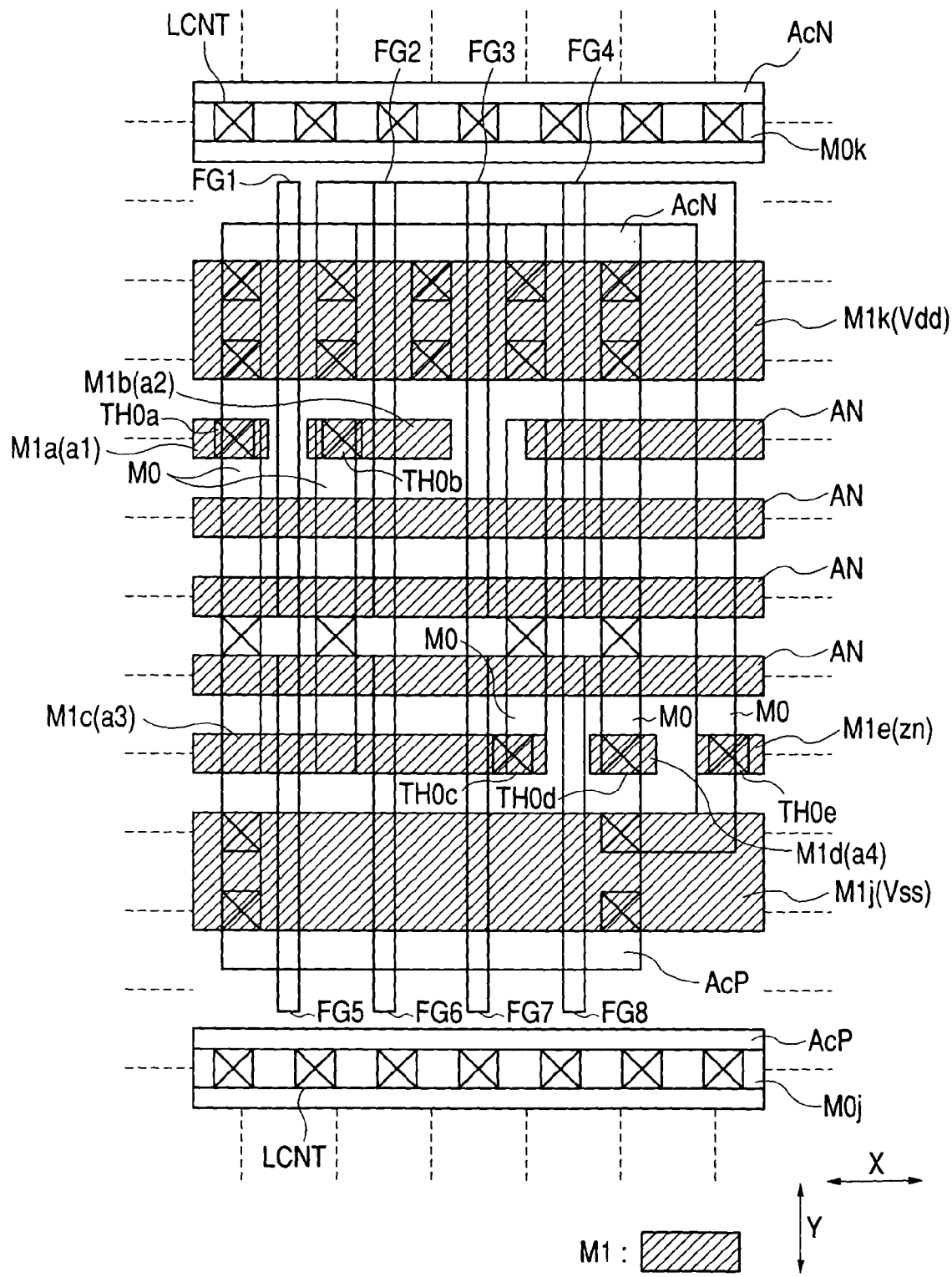
FIG. 34 is a plan view showing a pattern layout of various layers which constitute the four-input NAND cell in the sixth embodiment.

As shown in FIG. 32, between the gate electrodes FG, 0th layer wirings M0 extend in the Y direction along grids y, provided there are portions extending in the X direction. Connections TH0 are disposed on the 0th layer wirings M0 (FIG. 33) and first layer wirings M1 are disposed on the connections TH0 in the X direction along grids x (FIG. 34).

The first layer wiring M1a corresponds to the input terminal a1 and M1b corresponds to the input terminal a2. Likewise, M1c and M1d correspond to the input terminals a3 and a4, respectively. Further, M1e corresponds to the output terminal zn. A first layer wiring M1k is supplied with the supply voltage (Vdd) and M1j is supplied with the earth voltage (Vss). Of the 0th layer wirings, M0k is connected to a power supply portion of n type well and M0j is connected to a power supply portion of p type well.

The first layer wiring M1a extends leftwards from above a connection TH0a on a 0th layer wiring M0, while the first layer wiring M1b extends rightwards from above a connection TH0b on a 0th layer wiring M0. These wirings are positioned on the same grid x.

Therefore, the connection TH0a which underlies the first layer wiring M1a is displaced leftwards (leftward displacement) from the center of the associated 0th layer wiring M0, while the connection TH0b which underlies the first layer wiring M1b is displaced rightwards (rightward displacement) from the center of the associated 0th layer wiring M0.

The first layer wiring M1c extends leftwards from above a connection TH0c on a 0th layer wiring, the first layer wiring M1d is disposed so as to be short on a connection TH0d on a 0th layer wiring M0, and the first layer wiring M1e extends rightwards from above a connection TH0e on a 0th layer wiring M0. These wirings are positioned on the same grid x.

Therefore, the connection TH0c which underlies the first layer wiring M1c is displaced leftwards (leftward displacement) from the center of the associated 0th layer wiring M0, while the connection TH0e which underlies the first layer wiring M1e is displaced rightwards (rightward displacement) from the center of the associated 0th layer wiring M0. The connection TH0d which underlies the first layer wiring M1d is disposed at the center of the associated 0th layer wiring M0 (central layout). The other connections TH0 are also positioned centrally of 0th layer wirings.

With such a layout, it is possible to ensure a required wiring spacing in the X direction even if reservoirs are provided in the first layer wirings M1a, M1b. Accordingly, it is possible to improve the mounting efficiency of those wirings and dispose another M1 layer wiring (another net) on another grid x.

Figure 35:
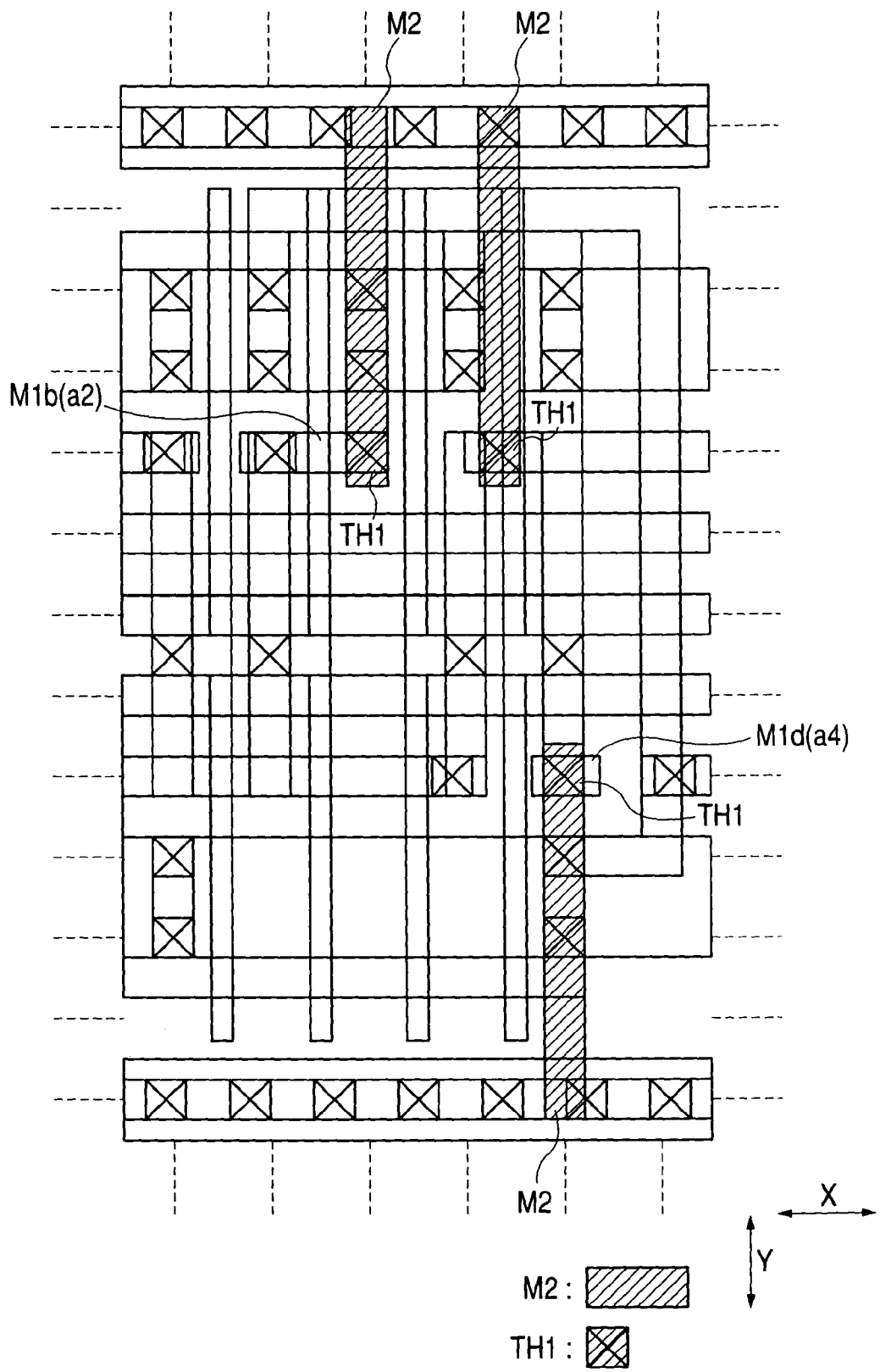
FIG. 35 is a plan view showing a pattern layout of various layers which constitute the four-input NAND cell in the sixth embodiment.

FIG. 35 shows an example of the layout of connections TH1 on first layer wirings M1 and second layer wirings M2 thereon.

Seventh Embodiment

Although in the previous description of the fifth and sixth embodiments reference has been made to NAND cells as examples, the present invention may also be applied to a wiring section of a basic cell used as a standard cell, e.g., inverter or AND circuit.

As examples of basic cells there are applicable, in addition to those described above, there are 3-input NAND, 2-input NOR, 3-input NOR, 4-input NOR, tri-state inverter, 2-1 selector, exclusive NOR, exclusive OR, 2-1AND-OR-inverter, 2-2AND-OR-inverter, 3-1AND-OR-inverter, 3-2AND-OR-inverter, 2-2-1AND-OR-inverter, 2-1OR-AND-inverter, 2-2OR-AND-inverter, 3-1OR-AND-inverter, 2-1-1OR-AND-inverter, 2-2-2OR-AND-inverter, D-latch, and edge-trigger FF.

The present invention is applicable not only to wiring in a specular layout of any of these basic cells but also to wiring among various types of basic cells.

Particularly, as described in connection with the fifth embodiment with reference to a 2NAND cell as an example, in many cases, gate electrodes FG of plural MISFETs which constitute a basic cell are arranged side by side in a predetermined certain direction and 0th layer wirings M0 are formed between them.

Figure 36:
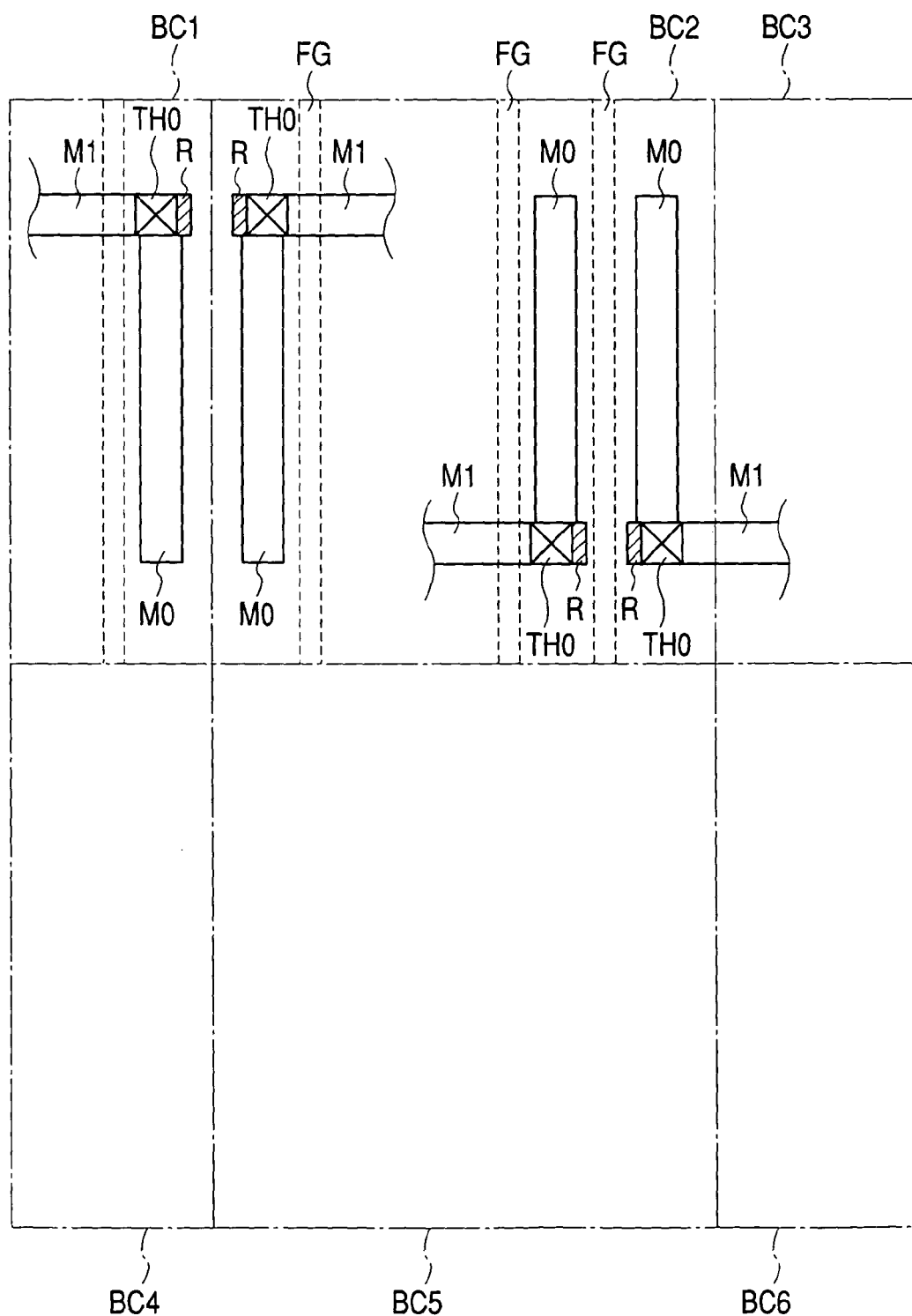
FIG. 36 is a plan view showing a state of connection in plural basic cells.

For reducing the cell area, there often is adopted a method wherein input terminals (a1, a2, . . . , an) or an output terminal (zn) is provided on 0th layer wirings M0 in the outer peripheral portion of the cell. Therefore, in the case where plural basic cells (BC1 to BC6) are disposed as in FIG. 36, it is very likely that reservoirs R of first layer wirings will be disposed close to each other at a boundary portion in the extending directions of the first layer wirings M1 of each cell.

In such an area, therefore, by using such a wiring layout as described in connection with any of the first embodiment to the fourth embodiment, it becomes possible to provide a layout of another wiring (another net) and hence it is possible to improve the wiring mounting efficiency.

Figure 37:
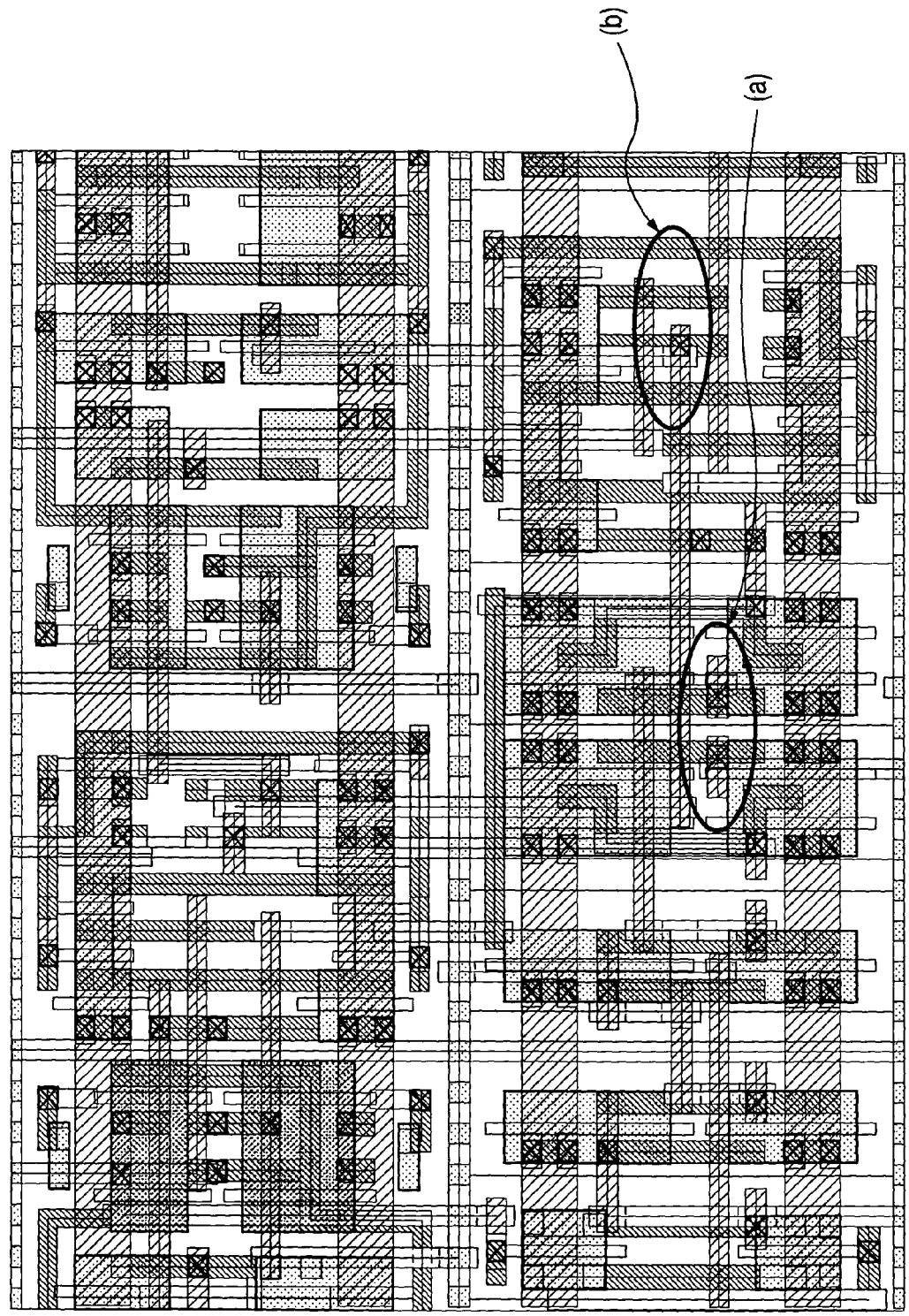
FIG. 37 is an example of a wiring layout among plural basic cells.

FIG. 37 is an example of a wiring layout in which the present inventors have wired between plural basic cells. For example, area (a) is an area to which the present invention is applied (both-offset layout), while area (b) is an area in which connections are not offset.

Thus, it goes without saying that connections need not be offset in an area where there is a margin between connections (wirings) and where a required wiring spacing can be ensured even if reservoirs are provided.

Further, the present invention is applicable to both intra-cell wiring and inter-cell wiring.

Thus, according to this embodiment, it is possible to attain microstructurization (reduction of chip size) and high integration of the semiconductor device. Besides, it is possible to shorten the length of wiring for cell-to-cell connection and attain a high-speed drive of the semiconductor device. Moreover, since the wiring length is shortened, it is possible to diminish the wiring resistance and reduce the power consumption of the semiconductor device. Further, with provision of the reservoirs, it is possible to improve the EM resistance and ensure a margin for pattern matching between wirings and connections.

Although the present invention has been described specifically by way of various embodiments thereof, it goes without saying that various changes may be made within a scope not departing from the gist of the invention.

Particularly, although in the fifth and sixth embodiments reference has been made to copper damascene wiring as an example, there may be used another conductive film may be used, or wiring may be formed by patterning a conductive film.

However, since copper atoms are apt to migrate and cause an EM phenomenon, there is a great need for the provision of reservoirs. Therefore, the present invention is effectively applicable to copper wiring.

Although in the above embodiments reference has been made to relatively lower layer wirings, such as 0th layer and first layer wirings, the present invention is also applicable to upper layer wirings, such as fourth and fifth layer wirings, and is widely applicable to wirings wherein lower layer wirings are laid at intervals of a minimum machining size or more.

Further, this invention is widely applicable to wirings formed on another semiconductor device other than the wirings on the MISFET.

The following is a brief description of typical effects achieved in the embodiments of the present invention.

The center of a connection between a first wiring and a second wiring (M1) extending in a first direction [X direction] orthogonal to the first wiring is offset from the center of the first wiring, whereby it is possible to ensure a surplus portion [reservoir] in a direction opposite to the offset direction. Moreover, since a projecting portion [notch] is formed in the first wiring portion located under the connection, it is possible to ensure a required spacing in the aforesaid first direction, and, hence, it is possible to improve the wiring density.

Further, it is possible to ensure a required spacing in the first direction of first wirings disposed on the same grid, so that in a second direction [Y direction] orthogonal to the first direction of the second wiring it is possible to dispose another wiring such as a third wiring [M1] on a grid adjacent thereto. Consequently, it is possible to improve the wiring freedom and wiring density.

The following is a brief description of effects attained by typical modes of the invention disclosed herein.

It is possible to improve the wiring mounting efficiency and improve the connection accuracy between wirings. It is also possible to attain microstructurization and high density of the semiconductor device. Further, it is possible to attain high performance of the semiconductor device.

What is claimed is:

1. A semiconductor device, comprising:
   (a) a first wiring and a second wiring extending in a first direction and being adjacent to each other;
   (b) a third wiring connected to the first wiring through a first connection and extending in a direction opposite to the second wiring and along a line orthogonal to the first direction, the third wiring having a first surplus portion projecting in the direction of the second wiring from the first connection; and
   (c) a fourth wiring connected to the second wiring through a second connection and extending along said line in a direction opposite to the first wiring, the fourth wiring having a second surplus portion projecting in the direction of the first wiring from the second connection,
   wherein the first, second, third, and fourth wirings are arranged such that,
   (d) a center of the second connection is offset in a direction opposite to the first wiring from a center of the second wiring, and
   (e) a projecting portion of the second wiring is disposed under the second connection,
   wherein a MISFET underlies the first and the second wirings, and
   wherein a gate electrode of the MISFET is disposed in the first direction between the first and the second wirings.

2. A method of manufacturing a semiconductor device, comprising the steps of:
   (a) disposing a first wiring and a second wiring extending in a first direction and being adjacent to each other;
   (b) disposing a third wiring being connected to the first wiring through a first connection and extending in a second direction orthogonal to the first direction and in opposition to the second wiring, the third wiring having a first surplus portion projecting in the direction of the second wiring from the first connection;
   (c) disposing a fourth wiring being connected to the second wiring through a second connection and extending in the second direction and in opposition to the first wiring, the fourth wiring having a second surplus portion projecting in the direction of the first wiring from the second connection;
   (d) determining whether the third wiring and the fourth wiring are positioned on the same line and whether the distance between the first and the second surplus portions is a predetermined distance or less;
   (e) if the distance between the first and the second surplus portions is the predetermined distance or less, displacing a center of the second connection from a center of the second wiring in a direction opposite to the first wiring; and
   (f) disposing a projecting portion of the second wiring under the second connection.

3. The method according to claim 2, wherein the spacing between a center of the first wiring and that of the second wiring is a unit distance in wiring.

4. The method according to claim 2, wherein the width of each of the first and the second wirings and the width of each of the first and the second connections are substantially equal to each other.

5. The method according to claim 2,
   wherein a MISFET underlies the first and the second wirings, and
   wherein a gate electrode of the MISFET is disposed in the first direction between the first and the second wirings.

6. The method according to claim 2, wherein a center of the first connection is disposed on a center of the first wiring.

7. The method according to claim 2, further comprising the steps of:
   (g) disposing a center of the first connection by offsetting it from a center of the first wiring in a direction opposite to the second wiring; and
   (h) disposing a projecting portion of the first wiring under the first connection.

8. The method according to claim 2, wherein a fifth wiring is disposed in parallel with the third wiring.

9. The method according to claim 2, wherein the distance between the third and the fifth wirings is smaller than the distance between the first and the second wirings.

10. The method according to claim 8, wherein the distance between the first and the second wirings is larger than a minimum machining size.

11. The method according to any of claims 8 to 10, wherein the width of each of the first and the second surplus portions is smaller than the difference (P0–P1) between a distance P1 between a center of the third wiring and that of the fifth wiring and a distance P0 between a center of the first wiring and that of the second wiring, and is larger than one half of the difference between the distances P1 and P0.

12. The method according to claim 11,
   wherein a MISFET underlies the first and the second wirings, and
   wherein the first wiring or the second wiring is connected to a source and a drain, or a gate electrode, of the MISFET.

13. The method according to any of claims 2 to 10, 4 or 5,
   wherein a MISFET underlies the first and the second wirings, and
   wherein the first wiring or the second wiring is connected to a source and a drain, or a gate electrode, of the MISFET.

14. A method of manufacturing a semiconductor device, comprising the steps of:
   (a) defining a first layout line of a first wiring layer extending in a first direction and a second layout line of a second wiring layer extending in a second direction orthogonal to the first direction;
   (b) disposing virtually a first wiring along the first layout line, the first wiring having projecting portions respectively on both sides of an intersecting point of the first and the second layout lines;
   (c) disposing a second wiring along the second layout line;
   (d) disposing a connection in an overlapped region of patterns of the first and the second wirings; and
   (e) defining a pattern of the first wiring with the projecting portions of the first wiring disposed only under the connection.

15. A semiconductor device comprising:
   (a) a first wiring and a second wiring extending in a first direction and being adjacent to each other;
   (b) a third wiring being connected to the first wiring through a first connection and extending in a second direction orthogonal to the first direction and in opposition to the second wiring, the third wiring having a first surplus portion projecting in the direction of the second wiring from the first connection;
(c) a fourth wiring being connected to the second wiring through a second connection and extending in the second direction and in opposition to the first wiring, the fourth wiring having a second surplus portion projecting in the direction of the first wiring from the second connection;
(d) the second connection being formed so that a center thereof is offset from a center of the second wiring in a direction opposite to the first wiring; and
(e) the second wiring having a projecting portion formed under the second connection,
wherein the distance between a center of the first wiring and that of the second wiring is a unit distance in wiring.

16. The semiconductor device according to claim 15, wherein the width of each of the first and the second wirings and the width of each of the first and the second connections are substantially equal to each other.

17. The semiconductor device according to claim 15, further comprising a MISFET which underlies the first and the second wirings,
wherein the first or the second wiring is connected to a source and a drain, or a gate electrode, of the MISFET.

18. The semiconductor device according to claim 15, wherein a center of the first connection is disposed on a center of the first wiring.

19. The semiconductor device according to claim 15, wherein:
(f) the first connection is formed so that a center thereof is offset from a center of the first wiring in a direction opposite to the second wiring; and
(g) the first wiring has a projecting portion formed under the first connection.

20. The semiconductor device according to claim 15, further comprising a fifth wiring formed in parallel with the third wiring.

21. The semiconductor device according to claim 20, wherein the distance between the third and the fifth wirings is smaller than the distance between the first and the second wirings.

22. A semiconductor device comprising:
(a) a first wiring and a second wiring extending in a first direction and being adjacent to each other;
(b) a third wiring being connected to the first wiring through a first connection and extending in a second direction orthogonal to the first direction and in opposition to the second wiring, the third wiring having a first surplus portion projecting in the direction of the second wiring from the first connection;
(c) a fourth wiring being connected to the second wiring through a second connection and extending in the second direction and in opposition to the first wiring, the fourth wiring having a second surplus portion projecting in the direction of the first wiring from the second connection;
(d) the second connection being formed so that a center thereof is offset from a center of the second wiring in a direction opposite to the first wiring; and
(e) the second wiring having a projecting portion formed under the second connection, and
further comprising a fifth wiring formed in parallel with the third wiring,
wherein the distance between the first and the second wirings is smaller than a minimum machining size.

23. A semiconductor device comprising:
(a) a first wiring and a second wiring extending in a first direction and being adjacent to each other;
(b) a third wiring being connected to the first wiring through a first connection and extending in a second direction orthogonal to the first direction and in opposition to the second wiring, the third wiring having a first surplus portion projecting in the direction of the second wiring from the first connection;
(c) a fourth wiring being connected to the second wiring through a second connection and extending in the second direction and in opposition to the first wiring, the fourth wiring having a second surplus portion projecting in the direction of the first wiring from the second connection;
(d) the second connection being formed so that a center thereof is offset from a center of the second wiring in a direction opposite to the first wiring; and
(e) the second wiring having a projecting portion formed under the second connection, and
further comprising a fifth wiring formed in parallel with the third wiring,
wherein the width of each of the first and the second surplus portions is smaller than the difference ($P0-P1$) between a distance $P1$ between a center of the third wiring and that of the fifth wiring and a distance $P0$ between a center of the first wiring and that of the second wiring, and is larger than one half of the difference between the distances $P1$ and $P0$.

24. A semiconductor device comprising:
(a) a first wiring and a second wiring extending in a first direction and being adjacent to each other;
(b) a third wiring being connected to the first wiring through a first connection and extending in a second direction orthogonal to the first direction and in opposition to the second wiring, the third wiring having a first surplus portion projecting in the direction of the second wiring from the first connection;
(c) a fourth wiring being connected to the second wiring through a second connection and extending in the second direction and in opposition to the first wiring, the fourth wiring having a second surplus portion projecting in the direction of the first wiring from the second connection;
(d) the second connection being formed so that a center thereof is offset from a center of the second wiring in a direction opposite to the first wiring; and
(e) the second wiring having a projecting portion formed under the second connection,
further comprising a MISFET which underlies the first and the second wirings, a gate electrode of the MISFET being disposed in the first direction between the first and the second wirings.

25. A semiconductor device comprising:
(a) a first wiring extending in a first direction;
(b) a second wiring connected to the first wiring through a connection and extending in a second direction orthogonal to the first direction, the second wiring having a surplus portion projecting in a direction opposite to the second direction;
(c) the connection being formed so that a center thereof is offset in the second direction from a center of the first wiring; and
(d) the first wiring having a projecting portion formed under the connection,
wherein the projecting portion is formed only under the connection.

26. A semiconductor device comprising:
(a) a first wiring and a second wiring extending in a first direction and being adjacent to each other;
(b) a third wiring being connected to the first wiring through a first connection and extending in a second direction orthogonal to the first direction and in opposition to the second wiring, the third wiring having a first surplus portion projecting in the direction of the second wiring from the first connection;
(c) a fourth wiring being connected to the second wiring through a second connection and extending in the second direction and in opposition to the first wiring, the fourth wiring having a second surplus portion projecting in the direction of the first wiring from the second connection;
(d) the second connection being formed so that a center thereof is offset from a center of the second wiring in a direction opposite to the first wiring; and
(e) the second wiring having a projecting portion formed under the second connection,
wherein the projecting portion is formed only under the second connection.

27. A semiconductor device (a) a first wiring extending in a first direction and having at least one projecting portion; and
(b) a second wiring connected to the first wiring through a first connection and extending from the first connection in a second direction orthogonal to the first direction, the second wiring having a first surplus portion projecting from the first connection in a direction opposite to the second direction,
the first connection being formed on the first wiring and the projecting portion thereof,
wherein the projecting portion is formed only under the first connection.

28. A method of manufacturing a semiconductor device comprising the steps of:
disposing:
(a) a first wiring extending in a first direction;
(b) a connection on the first wiring; and
(c) a terminal on the connection extending in a second direction orthogonal to the first direction and having a surplus portion, the surplus portion projecting from the connection in a direction opposite to the second direction, and
(d) disposing a second wiring in the second direction from the terminal,
wherein the first wiring includes a projecting portion disposed under the connection,
wherein the projecting portion is formed only under the connection.

29. A semiconductor device comprising:
(a) a first wiring extending in a first direction and having at least one projecting portion;
(b) a second wiring connected to the first wiring through a first connection formed on the first wiring and extending from the first connection in a second direction orthogonal to the first direction, the second wiring having a first surplus portion projecting from the first connection in a direction opposite to the second direction; and
(c) a third wiring connected to the first wiring through a second connection and extending from the second connection in a second direction orthogonal to the first direction, the third wiring having a second surplus portion projecting from the second connection in a direction opposite to the second direction, the second connection being formed on the first wiring and the projecting portion thereof,
wherein the projecting portion is formed only under the second connection.

30. A semiconductor device, comprising:
(a) a first wiring and a second wiring extending in a first direction and being adjacent to each other;
(b) a third wiring connected to the first wiring through a first connection and extending in a direction opposite to the second wiring and along a line orthogonal to the first direction, the third wiring having a first surplus portion projecting in the direction of the second wiring from the first connection; and
(c) a fourth wiring connected to the second wiring through a second connection and extending along said line in a second connection and extending along said line in a direction opposite to the first wiring, the fourth wiring having a second surplus portion projecting in the direction of the first wiring from the second connection,
wherein the first, second, third, and fourth wirings are arranged such that:
(d) a center of the second connection is offset in a direction opposite to the first wiring from a center of the second wiring,
(e) a projecting portion of the second wiring is disposed under the second connection, and
(f) a spacing between a center of the first wiring and a center of the second wiring is disposed under the second connection, and
(g) wherein a fifth wiring is disposed in parallel with the third wiring, and
(h) wherein said unit distance is larger than the spacing between a center of the third wiring and that of the fifth wiring.

31. A semiconductor device, comprising:
(a) a first wiring and a second wiring extending in a first direction and being adjacent to each other;
(b) a third wiring connected to the first wiring through a first connection and extending in a direction opposite to the second wiring and along a line orthogonal to the first direction, the third wiring having a first surplus portion projecting in the direction of the second wiring from the first connection; and
(c) a fourth wiring connected to the second wiring through a second connection and extending along said line in a direction opposite to the first wiring, the fourth wiring have a second surplus portion projecting in the direction of the first wiring from the second connection,
(d) a center of the second connection is offset in a direction opposite to the first wiring from a center of the second wiring,
(e) a projecting portion of the second wiring is disposed under the second connection, and
(f) a spacing between a center of the first wiring and that of the second wiring is a unit distance in wiring,
(g) wherein a fifth wiring is disposed in parallel with the third wiring, and
(h) where a distance between the third and the fifth wirings is smaller than the distance between the first and the second wirings.

32. The semiconductor device according to claim 31, wherein the distance between the first and the second wirings is larger than a minimum machining size.

33. The semiconductor device according to claim 31, wherein the width of each of the first and the second surplus portions is smaller than the difference (P0−P1) between a distance P1 between a center of the third wiring and that of the fifth wiring and a distance P0 between a center of the first wiring and that of the second wiring, and is larger than one half of the difference between the distances P1 and P0.

34. The semiconductor device according to claim 31, wherein the width of each of the first wiring and the second wiring and the width of each of the first connection and the second connection are substantially equal to each other.

35. The semiconductor device according to 31,
wherein a MISFET underlies the first and the second wirings, and
wherein the first or the second wiring is connected to a source and a drain, or a gate electrode, of the MISFET.

36. The semiconductor device according to claim 31, wherein a center of the first connection is disposed on a center of the first wiring.

37. The semiconductor device according to claim 31,
(f) wherein a center of the first connection is offset from a center of the first wiring in a direction opposite to the second wiring, and
(g) wherein a projecting portion of the first wiring is disposed under the first connection.

* * * * *